United States Patent
Irieda et al.

(10) Patent No.: US 11,038,486 B2
(45) Date of Patent: Jun. 15, 2021

(54) ACOUSTIC WAVE DEVICE

(71) Applicant: TAIYO YUDEN CO., LTD., Tokyo (JP)

(72) Inventors: Taisei Irieda, Tokyo (JP); Yoshio Satoh, Tokyo (JP); Tokihiro Nishihara, Tokyo (JP); Shinji Taniguchi, Tokyo (JP); Masumi Kida, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 308 days.

(21) Appl. No.: 15/409,881

(22) Filed: Jan. 19, 2017

(65) Prior Publication Data
US 2017/0214388 A1 Jul. 27, 2017

(30) Foreign Application Priority Data
Jan. 25, 2016 (JP) .............................. JP2016-011698

(51) Int. Cl.
*H03H 9/02* (2006.01)
*H03H 9/205* (2006.01)
(Continued)

(52) U.S. Cl.
CPC ........ *H03H 9/205* (2013.01); *H03H 9/02125* (2013.01); *H03H 9/13* (2013.01);
(Continued)

(58) Field of Classification Search
CPC .............................. H03H 9/205; H01L 41/047
(Continued)

(56) References Cited

U.S. PATENT DOCUMENTS

2002/0121840 A1 9/2002 Larson, III et al.
2005/0237132 A1* 10/2005 Sano ................... H03H 3/02
333/189

(Continued)

FOREIGN PATENT DOCUMENTS

JP 2002-299979 A 10/2002
JP 2006-319796 A 11/2006
(Continued)

OTHER PUBLICATIONS

Japanese Office Action dated Mar. 20, 2018, in a counterpart Japanese patent application No. 2016-011698. (A machine translation (not reviewed for accuracy) attached.).

(Continued)

*Primary Examiner* — Derek J Rosenau
(74) *Attorney, Agent, or Firm* — Chen Yoshimura LLP

(57) ABSTRACT

An acoustic wave device includes: a first resonator that includes a first piezoelectric substance, and first lower and upper electrodes sandwiching the first piezoelectric substance in a direction of a c-axis orientation or a polarization axis of the first piezoelectric substance; and a second resonator that is located closer to a signal input terminal than the first resonator is, is connected in series to the first resonator, includes a second piezoelectric substance, and second lower and upper electrodes sandwiching the second piezoelectric substance so that an electrode in a direction of the c-axis orientation or a polarization axis of the second piezoelectric substance has an electric potential identical to an electric potential of an electrode of the first resonator in the direction of the c-axis orientation or the polarization axis of the first piezoelectric substance, and has an antiresonant frequency less than an antiresonant frequency of the first resonator.

13 Claims, 23 Drawing Sheets

(51) Int. Cl.
   *H03H 9/70*   (2006.01)
   *H03H 9/17*   (2006.01)
   *H03H 9/60*   (2006.01)
   *H03H 9/13*   (2006.01)
(52) U.S. Cl.
   CPC ............ *H03H 9/173* (2013.01); *H03H 9/175* (2013.01); *H03H 9/605* (2013.01); *H03H 9/706* (2013.01)
(58) Field of Classification Search
   USPC ........................................ 310/312, 321, 324
   See application file for complete search history.

(56) References Cited

U.S. PATENT DOCUMENTS

| | | | |
|---|---|---|---|
| 2005/0248420 A1* | 11/2005 | Ma | H03H 3/04 333/191 |
| 2006/0255883 A1 | 11/2006 | Ebuchi | |
| 2006/0290446 A1 | 12/2006 | Aigner et al. | |
| 2008/0055021 A1 | 3/2008 | Ueda et al. | |
| 2008/0252398 A1 | 10/2008 | Jamneala et al. | |
| 2008/0290969 A1* | 11/2008 | Yamakawa | H03H 3/04 333/197 |
| 2012/0194034 A1* | 8/2012 | Miyake | H03H 9/132 310/320 |
| 2015/0130560 A1* | 5/2015 | Yokoyama | H03H 9/587 333/133 |

FOREIGN PATENT DOCUMENTS

| | | |
|---|---|---|
| JP | 2007-6495 A | 1/2007 |
| JP | 2008-85989 A | 4/2008 |
| JP | 2009-010932 A | 1/2009 |
| JP | 2010-021914 A | 1/2010 |
| JP | 2012-156907 A | 8/2012 |

OTHER PUBLICATIONS

Japanese Office Action dated Oct. 16, 2018, in a counterpart Japanese patent application No. 2016-011698. (A machine translation (not reviewed for accuracy) attached.).

* cited by examiner

- - - - - FIRST AND SECOND RESONATORS
——— ACOUSTIC WAVE DEVICE

ACOUSTIC WAVE DEVICE

CROSS-REFERENCE TO RELATED APPLICATION

This application is based upon and claims the benefit of priority of the prior Japanese Patent Application No. 2016-011698, filed on Jan. 25, 2016, the entire contents of which are incorporated herein by reference.

FIELD

A certain aspect of the present invention relates to an acoustic wave device.

BACKGROUND

Surface acoustic wave devices have been conventionally used for filters and duplexers of wireless communication devices such as mobile phone terminals. Recently, acoustic wave devices in which a piezoelectric substance is sandwiched between a lower electrode and an upper electrode have drawn attention as elements having good characteristics at high frequencies and being capable of being downsized and made to be monolithic. Piezoelectric thin film resonators such as Film Bulk Acoustic Resonators (FBARs) and Solidly Mounted Resonators (SMRs) have been known as such acoustic wave devices.

When a large electrical power is input to the piezoelectric thin film resonator, secondary distortion occurs in an output signal because of the non-linearity depending on the c-axis orientation of the piezoelectric substance. As techniques for reducing such secondary distortion, there has been known a technique that serially divides the piezoelectric thin film resonator, and makes the electrodes of the divided resonators in the c-axis orientation direction or the polarization axis direction of the piezoelectric substance of each of the divided resonators have an identical electric potential, or a technique that divides the piezoelectric thin film resonator in parallel and makes the electrodes of the divided resonators in the c-axis orientation direction or the polarization axis direction of the piezoelectric substance of each of the divided resonators have opposite electric potentials as disclosed in, for example, Japanese Patent Application Publication Nos. 2008-85989 and 2007-6495 (Patent Documents 1 and 2).

However, when a first resonator and a second resonator are connected in series so that the electrode of the first resonator in the c-axis orientation direction or the polarization axis direction of the piezoelectric substance has an electric potential identical to the electric potential of the electrode of the second resonator in the c-axis orientation direction or the polarization axis direction of the piezoelectric substance, it has been newly found that the secondary distortion locally deteriorates.

SUMMARY OF THE INVENTION

According to a first aspect of the present invention, there is provided an acoustic wave device including: a first resonator that includes a first piezoelectric substance, and a first lower electrode and a first upper electrode that sandwich the first piezoelectric substance in a direction of a c-axis orientation or a polarization axis of the first piezoelectric substance; and a second resonator that is located closer to a terminal to which a signal is input than the first resonator is, is connected in series to the first resonator, includes a second piezoelectric substance, and a second lower electrode and a second upper electrode that sandwich the second piezoelectric substance so that an electrode of the second resonator in a direction of a c-axis orientation or a polarization axis of the second piezoelectric substance has an electric potential identical to an electric potential of an electrode of the first resonator in the direction of the c-axis orientation or the polarization axis of the first piezoelectric substance, and has an antiresonant frequency less than an antiresonant frequency of the first resonator.

According to a second aspect of the present invention, there is provided an acoustic wave device including: a first resonator that includes a piezoelectric substance, and a first lower electrode and a first upper electrode that sandwich the piezoelectric substance; and a second resonator that is located closer to a terminal to which a signal is input than the first resonator is, is connected in series to the first resonator, includes the piezoelectric substance extending from the first resonator, and a second lower electrode and a second upper electrode that sandwich the piezoelectric substance, and has an antiresonant frequency less than an antiresonant frequency of the first resonator, wherein the first lower electrode and the second lower electrode share a single lower electrode, or the first upper electrode and the second upper electrode share a single upper electrode.

DETAILED DESCRIPTION

Hereinafter, embodiments of the present invention will be described with reference to the accompanying drawings.

First Embodiment

Figure 1A:
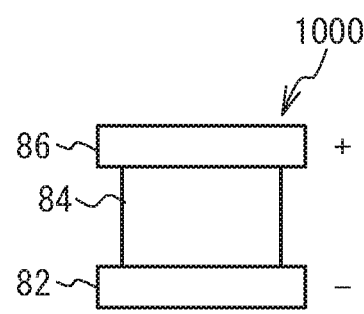
FIG. 1A and FIG. 1B illustrate a piezoelectric thin film resonator in which a piezoelectric substance is sandwiched between a lower electrode and an upper electrode.
Figure 1B:
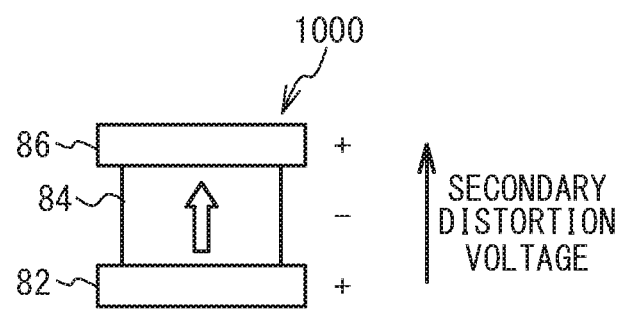

A description will first be given of a secondary distortion voltage produced in a piezoelectric substance of a piezoelectric thin film resonator. FIG. 1A and FIG. 1B illustrate a piezoelectric thin film resonator 1000 in which a piezoelectric substance 84 is sandwiched between a lower electrode 82 and an upper electrode 86. In the piezoelectric thin film resonator 1000, a half of the wavelength (λ) of the resonant frequency is equivalent to the thickness of a piezoelectric material. That is, the piezoelectric thin film resonator is a resonator using ½λ-thickness resonance. Therefore, as illustrated in FIG. 1A, the upper and lower surfaces of the piezoelectric substance 84 excite so that one of them polarizes positive (+) and the other polarizes negative (−).

On the other hand, the wavelength of the frequency of the secondary distortion is equivalent to the thickness of the piezoelectric substance. Thus, as illustrated in FIG. 1B, the upper and lower surfaces of the piezoelectric substance 84 excite so that both of them polarize positive (+) or negative (−). When the piezoelectric substance 84 has symmetry, the upper and lower electrodes have identical electric potentials in the secondary mode. In this case, the distortion component is not generated theoretically. However, when aluminum nitride (AlN) or zinc oxide (ZnO) is used as the piezoelectric substance 84 to obtain good characteristics, and the piezoelectric substance 84 is sandwiched between the lower electrode 82 and the upper electrode 86 in the c-axis orientation of the piezoelectric substance 84, the symmetry in the c-axis orientation is distorted, and the electric field may have uneven distributions. In FIG. 1B, an arrow in the piezoelectric substance 84 indicates the c-axis orientation direction of the piezoelectric substance 84. The uneven distribution of the electric field causes an electric potential difference between the upper and lower surfaces of the piezoelectric substance 84. A voltage thus generated is referred to as secondary distortion voltage, and indicated by another arrow lateral to the piezoelectric substance 84. In FIG. 1B, the c-axis is oriented in the direction from the lower electrode 82 to the upper electrode 86, and the secondary distortion voltage is produced in the above direction.

Figure 2A:
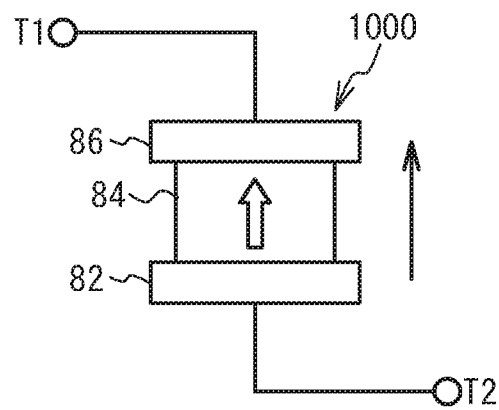
FIG. 2A illustrates a single piezoelectric thin film resonator.
Figure 2B:
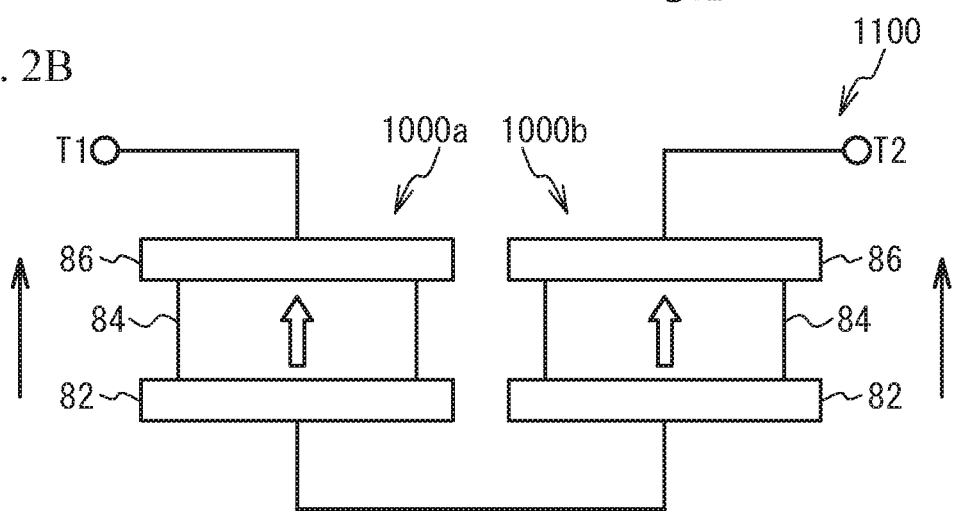
FIG. 2B and FIG. 2C illustrate an acoustic wave device in accordance with a first comparative example in which a single piezoelectric thin film resonator is divided into two piezoelectric thin film resonators.
Figure 2C:
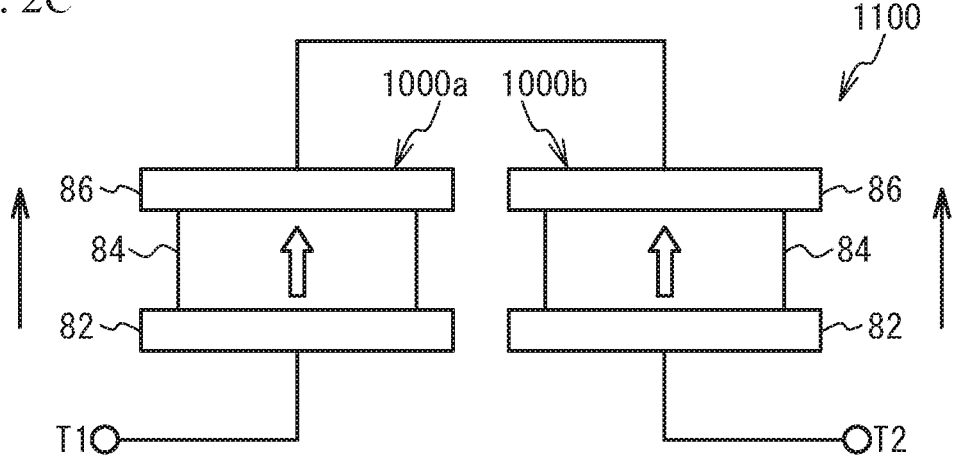

A method of reducing the secondary distortion voltage will be described with use of FIG. 2A and FIG. 2B. FIG. 2A illustrates a single piezoelectric thin film resonator 1000. FIG. 2B and FIG. 2C illustrate an acoustic wave device 1100 in accordance with a first comparative example in which the single piezoelectric thin film resonator 1000 is divided into two piezoelectric thin film resonators 1000a and 1000b (hereinafter, referred to as a first resonator 1000a and a second resonator 1000b). Each of the divided first and second resonators 1000a and 1000b has an electrostatic capacitance twice the electrostatic capacitance of the single piezoelectric thin film resonator 1000 before divided. Configuring the electrostatic capacitance as described above allows the electrical response before and after the division to be equivalent.

As illustrated in FIG. 2A, the single piezoelectric thin film resonator 1000 is connected between a terminal T1 and a terminal T2. The secondary distortion voltage of the piezoelectric thin film resonator 1000 is applied in a direction from the terminal T2 to the terminal T1.

In FIG. 2B, the first resonator 1000a and the second resonator 1000b are connected in series, and the first resonator 1000a and the second resonator 1000b are connected so that the electrode of the first resonator 1000a in the c-axis orientation direction of the piezoelectric substance 84 of the first resonator 1000a has an electric potential identical to the electric potential of the electrode of the second resonator 1000b in the c-axis orientation direction of the piezoelectric substance 84 of the second resonator 1000b. That is, the lower electrode 82 of the first resonator 1000a and the lower electrode 82 of the second resonator 1000b are connected so that the lower electrode 82 of the first resonator 1000a in a reverse direction of the c-axis orientation direction has an electric potential identical to the electric potential of the lower electrode 82 of the second resonator 1000b in a reverse direction of the c-axis orientation direction. Accordingly, the secondary distortion voltage of the first resonator 1000a is applied in a direction from the terminal T2 to the terminal T1, while the secondary distortion voltage of the second resonator 1000b is applied in a direction from the terminal T1 to the terminal T2. Therefore, the secondary distortion voltages of the first and second resonators 1000a and 1000b cancel out each other. As a result, the secondary distortion can be reduced.

In FIG. 2C, the upper electrode 86 of the first resonator 1000a and the upper electrode 86 of the second resonator 1000b are connected so that the upper electrode 86 of the first resonator 1000a in the c-axis orientation direction has an electric potential identical to the electric potential of the upper electrode 86 of the second resonator 1000b in the c-axis orientation direction. Accordingly, the secondary distortion voltage of the first resonator 1000a is applied in a direction from the terminal T1 to the terminal T2, while the secondary distortion voltage of the second resonator 1000b is applied in a direction from the terminal T2 to the terminal T1. Therefore, the secondary distortion voltages of the first and second resonators 1000a and 1000b cancel out each other. As a result, the secondary distortion can be reduced.

Here, a description will be given of simulations of admittance characteristics and secondary distortion characteristics of the piezoelectric thin film resonator 1000 illustrated in FIG. 2A and the acoustic wave device 1100 of the first comparative example illustrated in FIG. 2B and FIG. 2C. The simulation was conducted in a state in which the effect of the wiring line between the first resonator 1000a and the second resonator 1000b is excluded. In addition, the piezoelectric thin film resonator 1000 was assumed to have a resonant frequency of 2545 MHz, an electromechanical coupling coefficient of 6.596%, and an electrostatic capacitance of 1 pF. Each of the first and second resonators 1000a and 1000b was assumed to have a resonant frequency of 2545 MHz, an electromechanical coupling coefficient of 6.596%, and an electrostatic capacitance of 2 pF.

Figure 3A:
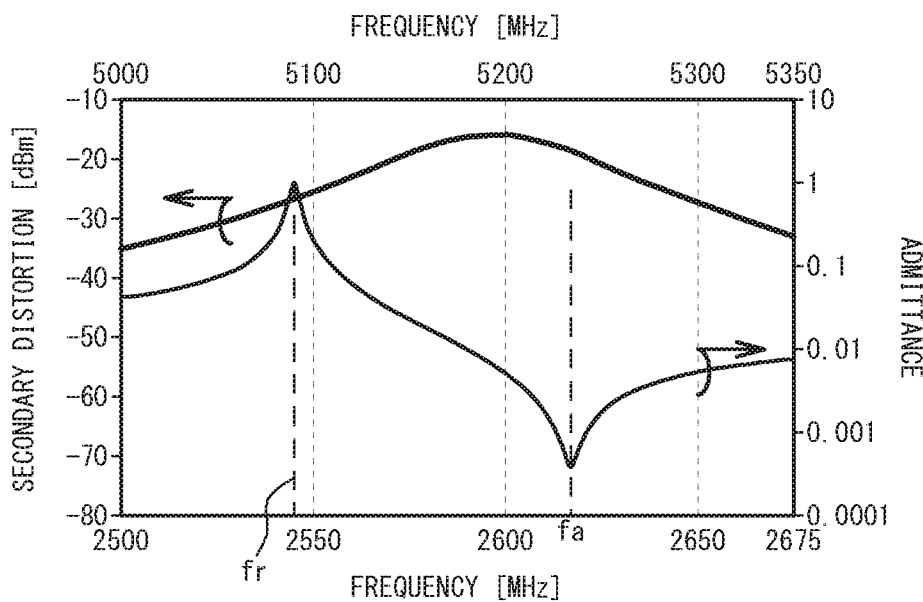
FIG. 3A illustrates simulation results of the piezoelectric thin film resonator.
Figure 3B:
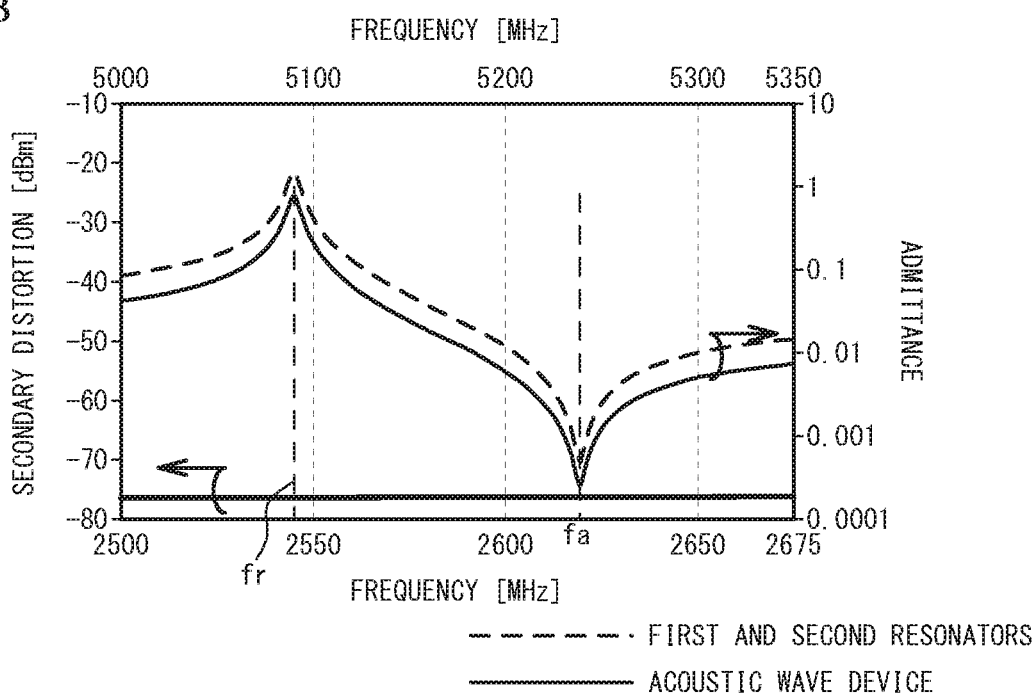
FIG. 3B illustrates simulation results of the acoustic wave device in accordance with the first comparative example.

FIG. 3A illustrates simulation results of the piezoelectric thin film resonator 1000, and FIG. 3B illustrates simulation results of the acoustic wave device 1100 of the first comparative example. The lower horizontal axis in FIG. 3A and FIG. 3B represents the frequency (MHz) of the admittance characteristic. The upper horizontal axis represents the frequency (MHz) of the secondary distortion characteristic. The right vertical axis represents admittance, and the left vertical axis represents secondary distortion (dBm). In addition, the dashed line in FIG. 3B indicates the admittance characteristics of the first and second resonators 1000a and 1000b, and the thin solid line indicates the admittance characteristic of the acoustic wave device 1100 of the first comparative example.

As illustrated in FIG. 3A and FIG. 3B, the admittance characteristic was approximately the same between the piezoelectric thin film resonator 1000 and the acoustic wave device 1100. This is considered because each resonator had the same resonant frequency and the same electromechanical coupling coefficient, and the electrostatic capacitances of the first and second resonators 1000a and 1000b were twice the electrostatic capacitance of the piezoelectric thin film resonator 1000. In contrast, in the acoustic wave device 1100, the secondary distortion was reduced compared to that in the piezoelectric thin film resonator 1000. This is considered because in the acoustic wave device 1100, the first resonator 1000a and the second resonator 1000b are connected in series so that the electrode of the first resonator 1000a in the c-axis orientation direction of the piezoelectric substance 84 has an electric potential identical to the electric potential of the electrode of the second resonator 1000b in the c-axis orientation direction of the piezoelectric substance 84, and the secondary distortion voltages thereby cancel out each other.

As illustrated in FIG. 3B, when the first resonator 1000a and the second resonator 1000b are connected in series so that the electrode of the first resonator 1000a in the c-axis orientation direction of the piezoelectric substance 84 has an electric potential identical to the electric potential of the electrode of the second resonator 1000b in the c-axis orientation direction of the piezoelectric substance 84, the secondary distortion can be well reduced theoretically. However, to connect the first resonator 1000a and the second resonator 1000b in series, a wiring line needs to be located between the first resonator 1000a and the second resonator 1000b. Thus, the effect of the parasitic component due to the wiring line is caused. The parasitic component of the wiring line appears as a floating capacitance between the wiring line and a ground.

Figure 4:
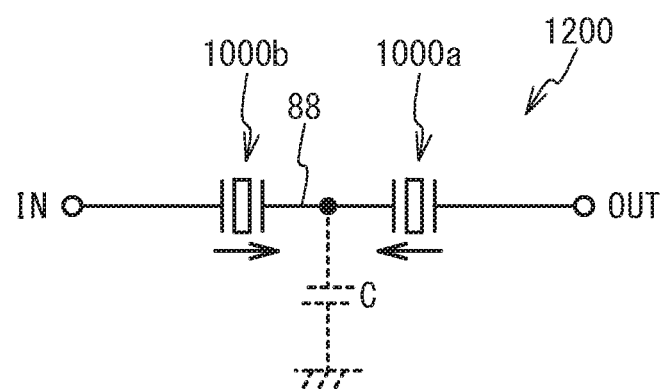
FIG. 4 illustrates an acoustic wave device in accordance with a second comparative example.

FIG. 4 illustrates an acoustic wave device 1200 in accordance with a second comparative example. As illustrated in FIG. 4, in the acoustic wave device 1200 of the second comparative example, the first resonator 1000a and the second resonator 1000b are connected in series between an input terminal IN and an output terminal OUT. A floating capacitance C is generated between a wiring line 88 between the first resonator 1000a and the second resonator 1000b and a ground. Other structures are the same as those of the acoustic wave device 1100 of the first comparative example, and the description thereof is thus omitted. Arrows located at the sides of the first and second resonators 1000a and 1000b indicate the directions in which the respective secondary distortion voltages are applied.

Figure 5A:
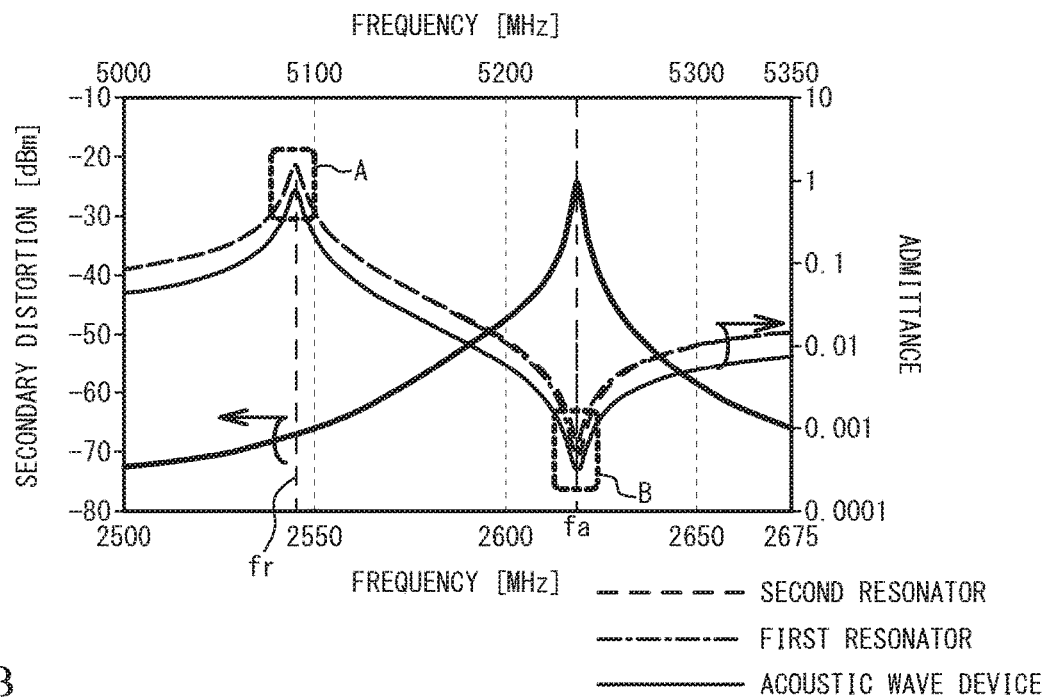
FIG. 5A illustrates simulation results of the admittance characteristic and the secondary distortion characteristic of the acoustic wave device in accordance with the second comparative example.
Figure 5B:
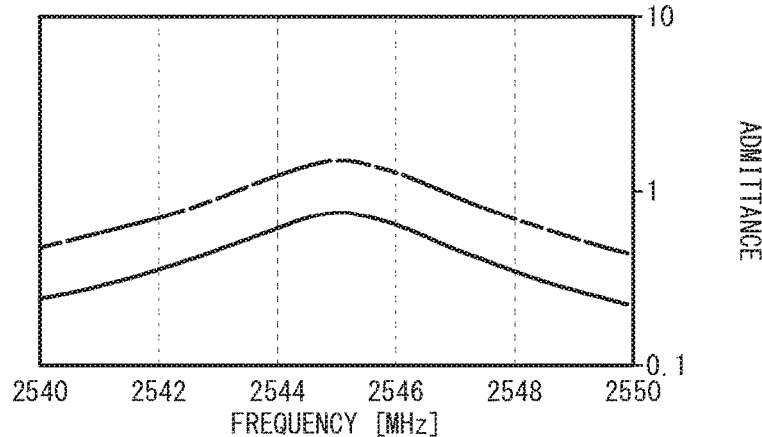
FIG. 5B is an enlarged view of a region A in FIG. 5A.
Figure 5C:
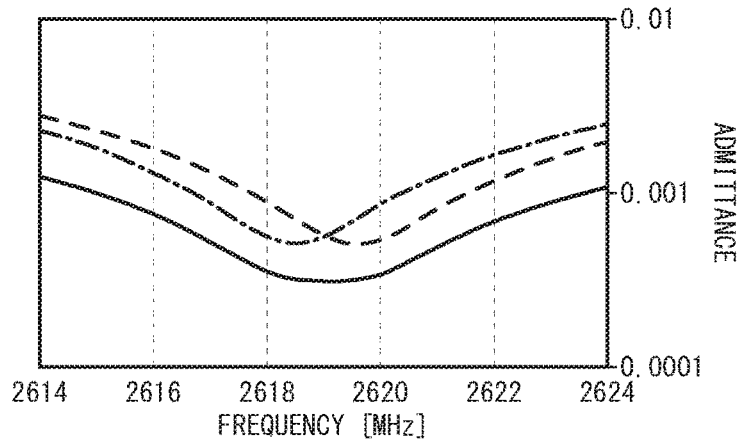
FIG. 5C is an enlarged view of a region B in FIG. 5A.

FIG. 5A illustrates simulation results of the admittance characteristic and the secondary distortion characteristic of the acoustic wave device 1200 in accordance with the second comparative example. FIG. 5B is an enlarged view of a region A around the resonant frequency fr in FIG. 5A, and FIG. 5C is an enlarged view of a region B around the antiresonant frequency fa in FIG. 5A. The lower horizontal axis in FIG. 5A represents the frequency (MHz) of the admittance characteristic. The upper horizontal axis represents the frequency (MHz) of the secondary distortion characteristic. The right vertical axis represents admittance, and the left vertical axis represents secondary distortion (dBm). The horizontal axis in FIG. 5B and FIG. 5C represents frequency (MHz), and the vertical axis represents admittance. Dashed lines indicate the admittance characteristic of the second resonator 1000b, chain lines indicate the admittance characteristic of the first resonator 1000a to which the floating capacitance C is connected, and thin solid lines indicate the admittance characteristic of the acoustic wave device 1200 of the second comparative example. In the simulation, the first resonator 1000a and the second resonator 1000b were assumed to have a resonant frequency of 2545 MHz, an electromechanical coupling coefficient of 6.596%, and an electrostatic capacitance of 2 pF. The floating capacitance C was set to 0.03 pF.

As illustrated in FIG. 5A, in the acoustic wave device 1200 of the second comparative example, the secondary distortion locally deteriorated at around the antiresonant frequency fa. As illustrated in FIG. 5B, the resonant frequency of the first resonator 1000a to which the floating capacitance C was connected showed little difference from the resonant frequency of the second resonator 1000b. In contrast, as illustrated in FIG. 5C, the antiresonant frequency of the first resonator 1000a to which the floating capacitance C was connected shifted to a frequency lower than that of the second resonator 1000b. It is considered that the generated difference in antiresonant frequency between the first resonator 1000a and the second resonator 1000b makes it difficult for harmonics at around the antiresonant frequency to cancel out each other, causing the local deterioration of the secondary distortion as illustrated in FIG. 5A.

Figure 6A:
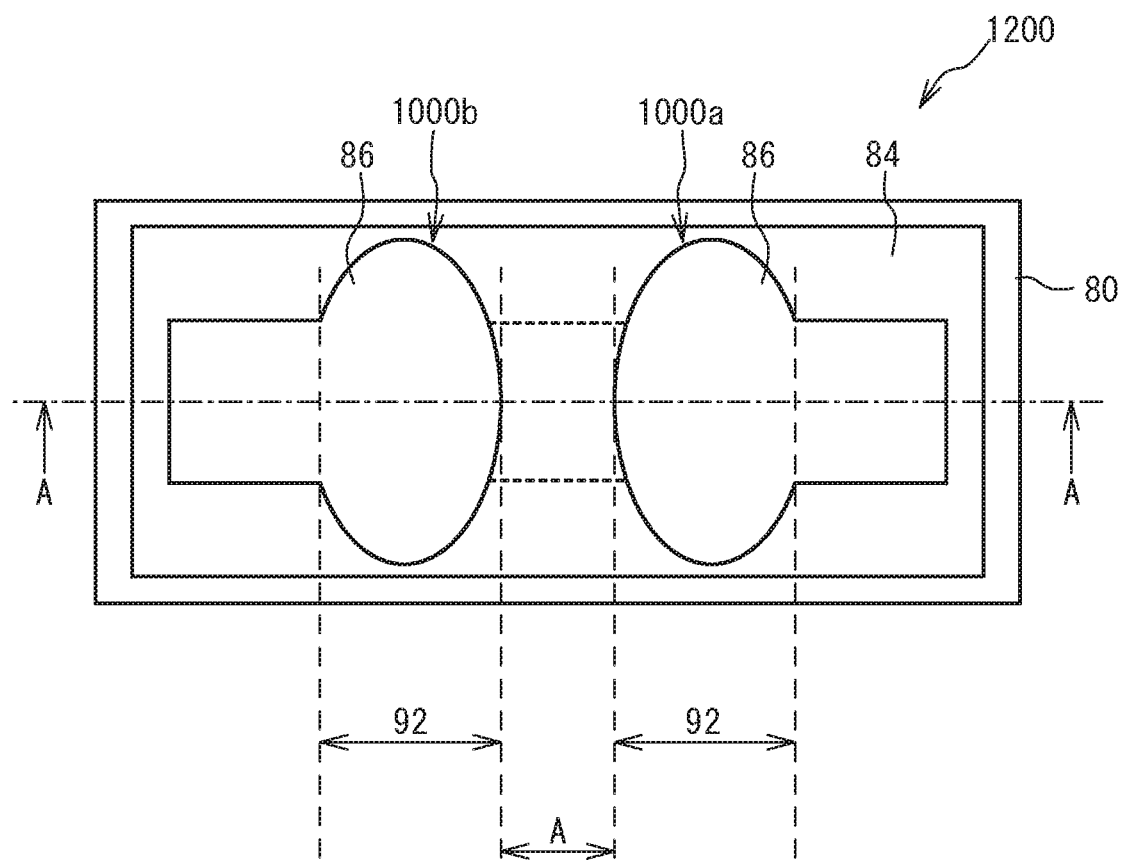
FIG. 6A is a plan view of an acoustic wave device in accordance with the second comparative example.
Figure 6B:
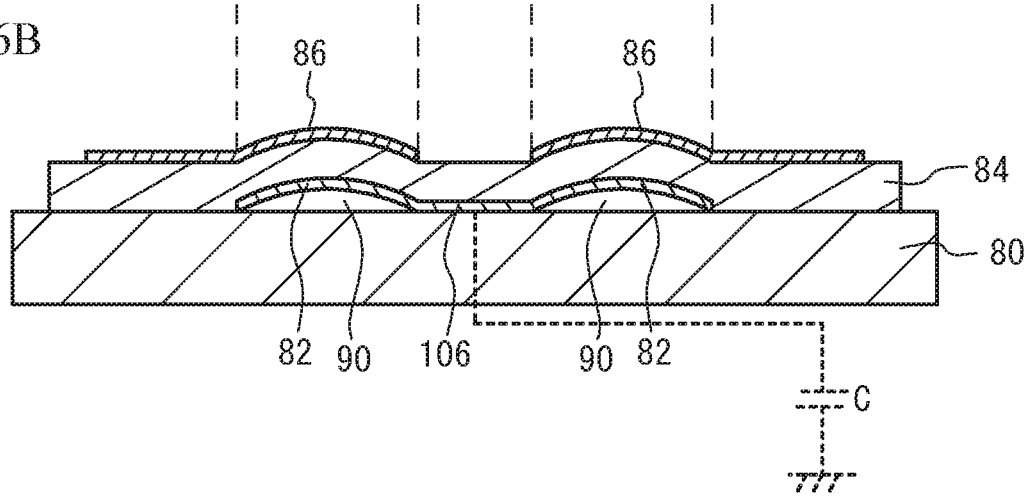
FIG. 6B is a cross-sectional view taken along line A-A in FIG. 6A.

Here, a description will be given of a floating capacitance generated between the wiring line between the first resonator 1000a and the second resonator 1000b and a ground. FIG. 6A is a plan view of the acoustic wave device 1200 in accordance with a second comparative example, and FIG. 6B is a cross-sectional view taken along line A-A in FIG. 6A. As illustrated in FIG. 6A and FIG. 6B, each of the first and second resonators 1000a and 1000b constituting the acoustic wave device 1200 of the second comparative example includes the lower electrode 82 located on a substrate 80. The piezoelectric substance 84 is located on the lower electrode 82. The upper electrode 86 is located on the piezoelectric substance 84. An air gap 90 is located between the substrate 80 and the lower electrode 82 in a region where the lower electrode 82 and the upper electrode 86 face each other across the piezoelectric substance 84. The region where the lower electrode 82 and the upper electrode 86 face each other across the piezoelectric substance 84 above the air gap 90 forms a resonance region 92.

The piezoelectric substance 84 of the first resonator 1000a and the piezoelectric substance 84 of the second resonator 1000b share a single piezoelectric substance. That is, the first resonator 1000a and the second resonator 1000b share the same piezoelectric substance 84. The lower electrode 82 of the first resonator 1000a and the lower electrode 82 of the second resonator 1000b are coupled to each other. This structure connects the first resonator 1000a and the second resonator 1000b in series so that the electrode of the first resonator 1000a in the c-axis orientation direction of the piezoelectric substance 84 has an electric potential identical to the electric potential of the electrode of the second resonator 1000b in the c-axis orientation direction of the piezoelectric substance 84.

A part corresponding to the wiring line connecting the first and second resonators 1000a and 1000b is the lower electrode 82 located in the region A. Since the lower electrode 82 of the first resonator 1000a and the lower electrode 82 of the second resonator 1000b share the lower electrode 82 in the region A, the floating capacitance C is generated between the whole of them and a ground.

Figure 7A:
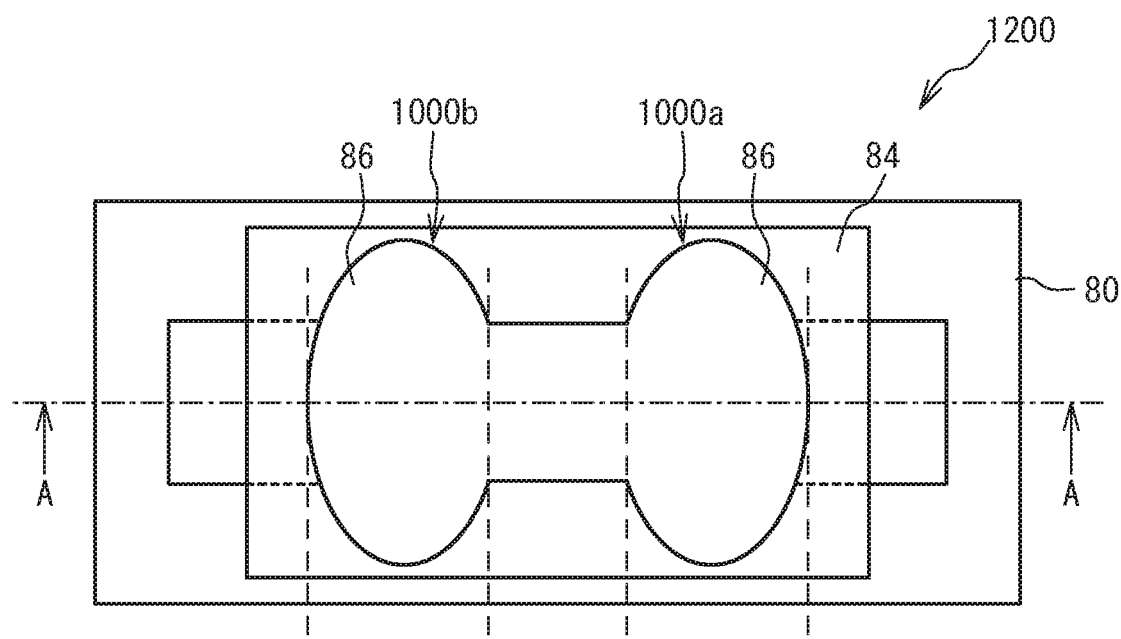
FIG. 7A is a plan view of an acoustic wave device in accordance with the second comparative example.
Figure 7B:
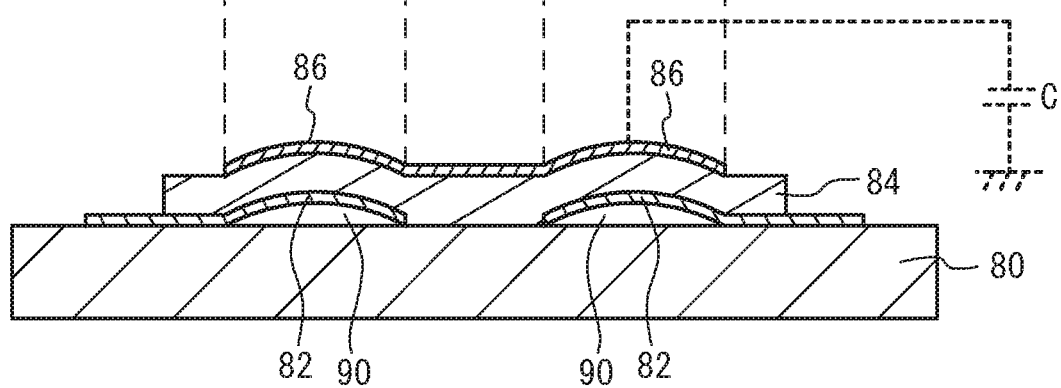
FIG. 7B is a cross-sectional view taken along line A-A in FIG. 7A.

FIG. 6A and FIG. 6B illustrate an exemplary case where the lower electrodes 82 of the first and second resonators 1000a and 1000b are coupled to each other, but the upper electrodes 86 of them may be coupled to each other. This case will be described with FIG. 7A and FIG. 7B. FIG. 7A is a plan view of the acoustic wave device 1200 in accordance with the second comparative example, and FIG. 7B is a cross-sectional view taken along line A-A in FIG. 7A. As illustrated in FIG. 7A and FIG. 7B, the upper electrode 86 of the first resonator 1000a and the upper electrode 86 of the second resonator 1000b are coupled to each other. Accordingly, the first resonator 1000a and the second resonator 1000b are connected in series so that the electrode of the first resonator 1000a in the c-axis orientation direction of the piezoelectric substance 84 has an electric potential identical to the electric potential of the electrode of the second resonator 1000b in the c-axis orientation direction of the piezoelectric substance 84.

A part corresponding to the wiring line connecting the first and second resonators 1000a and 1000b is the upper electrode 86 located in the region A. Since the upper electrode 86 of the first resonator 1000a and the upper electrode 86 of the second resonator 1000b share the upper electrode 86 in the region A, the floating capacitance C is generated between the whole of them and a ground.

A ground that generates a floating capacitance between the ground and a wiring line may be a ground that is formed on the substrate 80 on which the first and second resonators 1000a and 1000b are also formed and of which the distance to the first and second resonators 1000a and 1000b is small, a ground that is not formed on the substrate 80 and of which the distance to the first and second resonators 1000a and 1000b is long, or so on. Even when a ground is not formed on the substrate 80, a floating capacitance may be generated between the wiring line and a ground via the air or the substrate 80.

The simulation results of the acoustic wave device 1200 of the second comparative example illustrated in FIG. 5A through FIG. 5C reveal that the antiresonant frequency of the first resonator 1000a, which is located more distant from the input terminal IN, shifts to a lower frequency. Thus, when the antiresonant frequency of the second resonator 1000b is preliminarily set to a frequency lower than that of the first resonator 1000a in consideration of the floating capacitance generated between the wiring line and a ground, the antiresonant frequencies of the first and second resonators 1000a and 1000b can be made to be close to each other, and it is considered that the local deterioration of the secondary distortion can be reduced. On the basis of the above discussion, embodiments capable of reducing the secondary distortion well will be described hereinafter.

Figure 8:
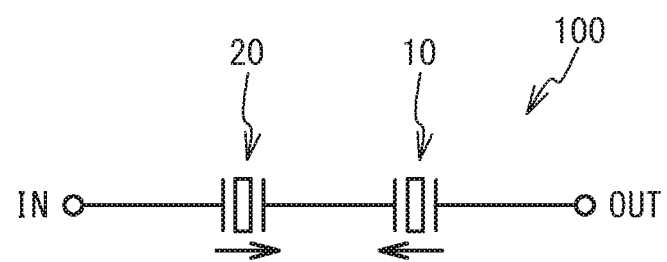
FIG. 8 illustrates an acoustic wave device in accordance with a first embodiment.

FIG. 8 illustrates an acoustic wave device in accordance with a first embodiment. As illustrated in FIG. 8, an acoustic wave device 100 of the first embodiment includes a first piezoelectric thin film resonator 10 (hereinafter, referred to as a first resonator 10) and a second piezoelectric thin film resonator 20 (hereinafter, referred to as a second resonator 20) connected in series between the input terminal IN and the output terminal OUT. The first resonator 10 and the second resonator 20 are connected in series so that the electrode of the first resonator 10 in the c-axis orientation direction of the piezoelectric substance of the first resonator 10 has an electric potential identical to the electric potential of the electrode of the second resonator 20 in the c-axis orientation direction of the piezoelectric substance of the second resonator 20. Thus, the secondary distortion voltage of the first resonator 10 and the secondary distortion voltage of the second resonator 20 are applied in the inverse directions. Arrows located at the sides of the first and second resonators 10 and 20 indicate the directions in which the respective secondary distortion voltages are applied.

Figure 9A:
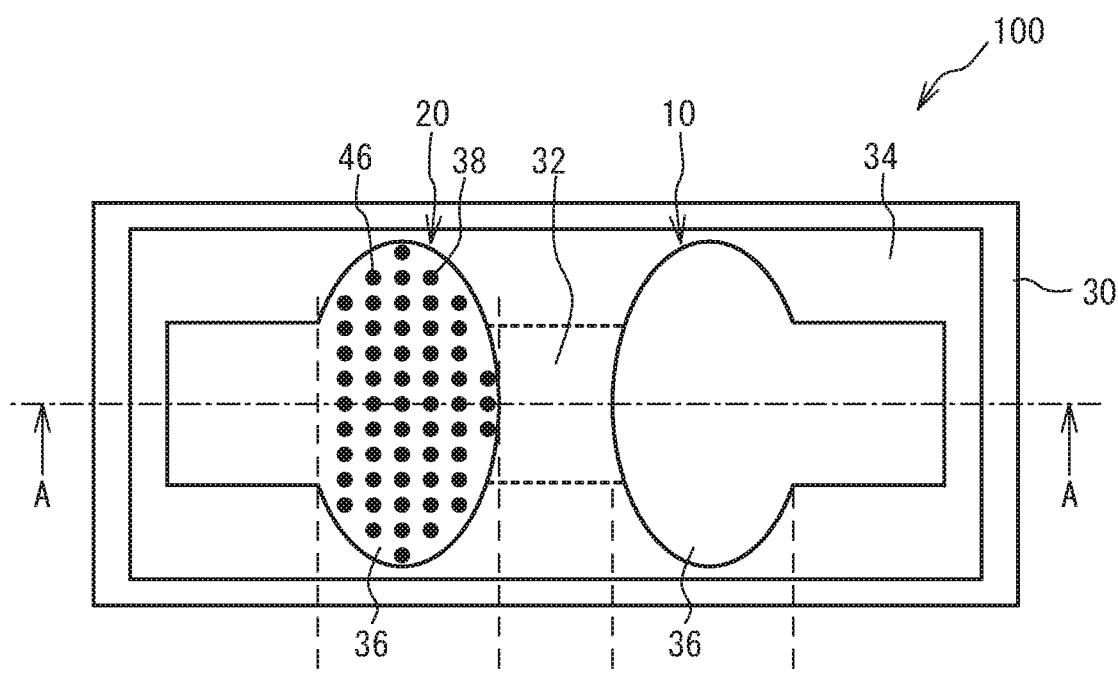
FIG. 9A is a plan view of an acoustic wave device in accordance with the first embodiment.
Figure 9B:
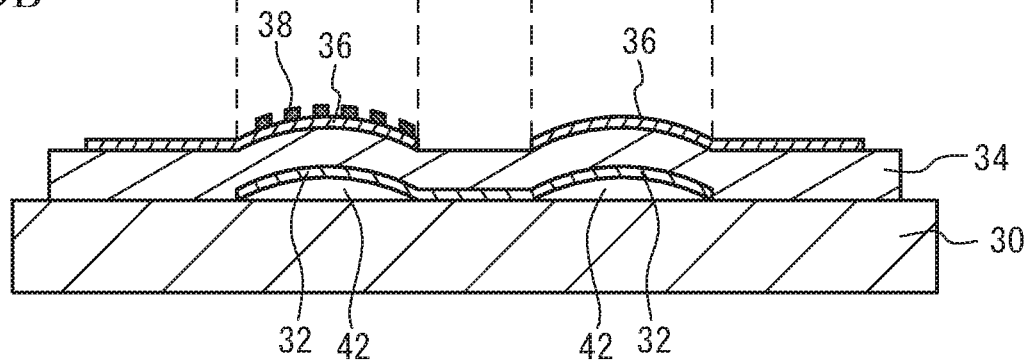
FIG. 9B is a cross-sectional view taken along line A-A in FIG. 9A.

FIG. 9A is a plan view of the acoustic wave device 100 in accordance with the first embodiment, and FIG. 9B is a cross-sectional view taken along line A-A in FIG. 9A. As illustrated in FIG. 9A and FIG. 9B, each of the first and second resonators 10 and 20 constituting the acoustic wave device 100 of the first embodiment includes a lower electrode 32 located on a substrate 30 made of, for example, a silicon (Si) substrate. Between the flat upper surface of the substrate 30 and the lower electrode 32, formed is an air gap 42 with a dome-shaped bulge toward the lower electrode 32. The dome-shaped bulge is a bulge having a shape in which, for example, the height of the air gap 42 is low around the periphery of the air gap 42 and increases at closer distances to the center of the air gap 42. The first resonator 10 and the second resonator 20 share the same lower electrode 32. The lower electrode 32 is formed of a multilayered film including, for example, a lower layer made of a chrome (Cr) film and an upper layer made of a ruthenium (Ru) film.

Located on the lower electrode 32 and the substrate 30 is a piezoelectric substance 34 made of, for example, an aluminum nitride (AlN) film having the main axis in the (002) direction. The first resonator 10 and the second resonator 20 share the same piezoelectric substance 34. An upper electrode 36 is located on the piezoelectric substance 34 so as to have a region (a resonance region 44) in which the upper electrode 36 faces the lower electrode 32 across the piezoelectric substance 34 above the air gap 42. The upper electrode 36 is formed of a multilayered film including, for example, a lower layer made of a Ru film and an upper layer made of a Cr film. The resonance region 44 has, for example, an elliptical shape, and is a region in which the acoustic wave in the thickness extension mode resonates. The resonance region 44 may have a shape such as a polygonal shape other than the elliptical shape.

In the resonance region 44 of the second resonator 20, a mass load film 38 is located on the upper electrode 36. The mass load film 38 is formed of, for example, a titanium (Ti) film. The mass load film 38 has island-shaped patterns 46. The island-shaped patterns 46 may have identical dimensions as viewed from above, or may have different dimensions. The island-shaped patterns 46 may be arranged at regular intervals, or at irregular intervals. The shape of the island-shaped patterns 46 is not limited to a circle as viewed from above, and may be other shapes such as a rectangular or an ellipse. The mass load film 38 is not located in the resonance region 44 of the first resonator 10. Thus, in the first resonator 10, the multilayered film in the resonance region 44 is formed of the lower electrode 32, the piezoelectric substance 34, and the upper electrode 36. On the other hand, in the second resonator 20, the multilayered film in the resonance region 44 is formed of the lower electrode 32, the piezoelectric substance 34, the upper electrode 36, and the mass load film 38.

The substrate 30 may be, for example, a quartz substrate, a glass substrate, a ceramic substrate, or a gallium arsenide (GaAs) substrate instead of a Si substrate. The lower electrode 32 and the upper electrode 36 may be formed of a single-layer metal film of, for example, aluminum (Al), titanium (Ti), copper (Cu), molybdenum (Mo), tungsten (W), tantalum (Ta), platinum (Pt), rhodium (Rh), or iridium (Ir), or a multilayered film of at least two of them instead of Cr and Ru.

The piezoelectric substance 34 may be made of, for example, a zinc oxide (ZnO) film instead of an MN film. Alternatively, the piezoelectric substance 34 may be mainly composed of aluminum nitride and contain other elements for improving resonance characteristics or for improving piezoelectricity. For example, the use of scandium (Sc) as an additive element improves the piezoelectricity of the piezoelectric substance 34. The mass load film 38 may be formed of a single-layer metal film of, for example, Cr, Ru, Al, Cu, Mo, W, Ta, Pt, Rh, or Ir, or a multilayered film of at least two of them instead of Ti. Alternatively, the mass load film 38 may be made of an insulating film such as metal nitride or metal oxide, but is preferably made of a metal to reduce the resistance of the upper electrode 36.

Here, the relationship between the mass load film and the antiresonant frequency will be described. In a piezoelectric thin film resonator formed by stacking a lower electrode, a piezoelectric substance, an upper electrode, and a mass load film, simulated was the antiresonant frequency when the coverage of the mass load film was varied. The coverage of the mass load film is a ratio of the total area of the mass load film to the area of the resonance region. That is, a coverage of 0% represents the condition in which the mass load film is not located at all, and a coverage rate of 100% represents the condition in which the mass load film is formed across the entire surface of the resonance region. Table 1 lists the parameters of the piezoelectric thin film resonator on which the simulation was conducted.

TABLE 1

|  |  | Film thickness [nm] |
|---|---|---|
| Mass load film | Ti | 22 |
| Upper electrode | Cr | 23 |
|  | Ru | 183 |
| Piezoelectric substance | AlN | 957 |
| Lower electrode | Ru | 152 |
|  | Cr | 76 |

Figure 10:
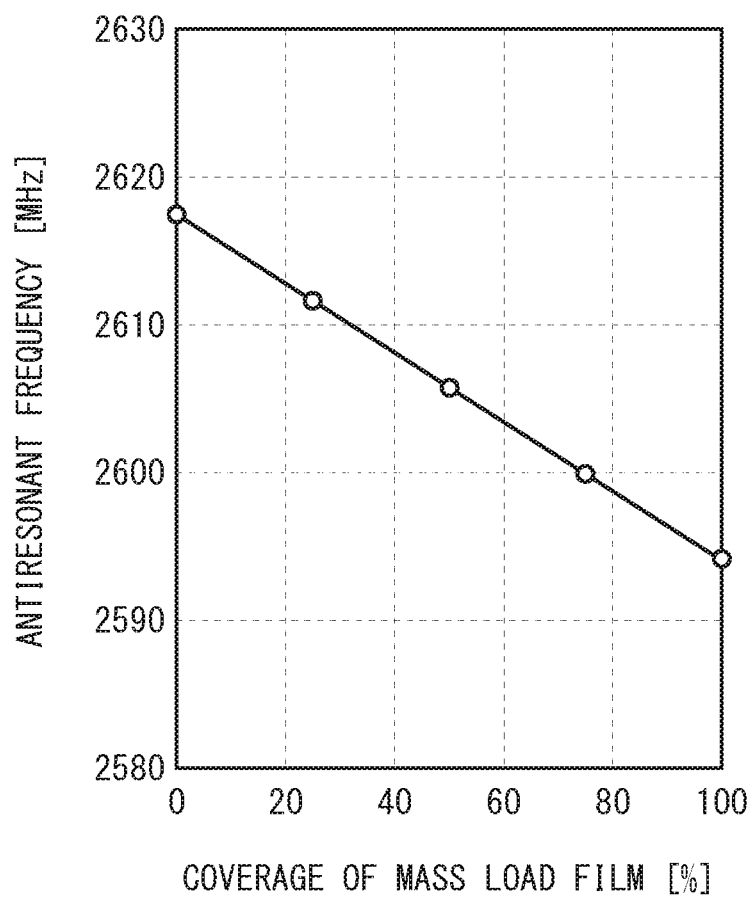
FIG. 10 illustrates simulation results indicating a relationship between a coverage of a mass load film and an antiresonant frequency.

FIG. 10 illustrates simulation results indicating the relationship between the coverage of the mass load film and the antiresonant frequency. As illustrated in FIG. 10, as the coverage of the mass load film increases, the antiresonant frequency linearly decreases. This result reveals that in the acoustic wave device 100 of the first embodiment, the antiresonant frequency of the second resonator 20 is lower than that of the first resonator 10. This result also reveals that the adjustment of the coverage of the mass load film allows a desired antiresonant frequency to be achieved.

Thus, the simulation was conducted on the acoustic wave device 100 of the first embodiment of which the coverage of the mass load film 38 was adjusted so that the antiresonant frequency of the second resonator 20 was 1.058 MHz lower than that of the first resonator 10. In the simulation, both the first and second resonators 10 and 20 were assumed to have an electromechanical coupling coefficient of 6.569%, and an electrostatic capacitance of 2 pF. The resonant frequency of the first resonator 10 was set to 2545 MHz, and the resonant frequency of the second resonator 20 was set to (2545-1.058) MHz. In addition, the floating capacitance generated between the wiring line between the first resonator 10 and the second resonator 20 and a ground was set to 0.03 pF.

Figure 11A:
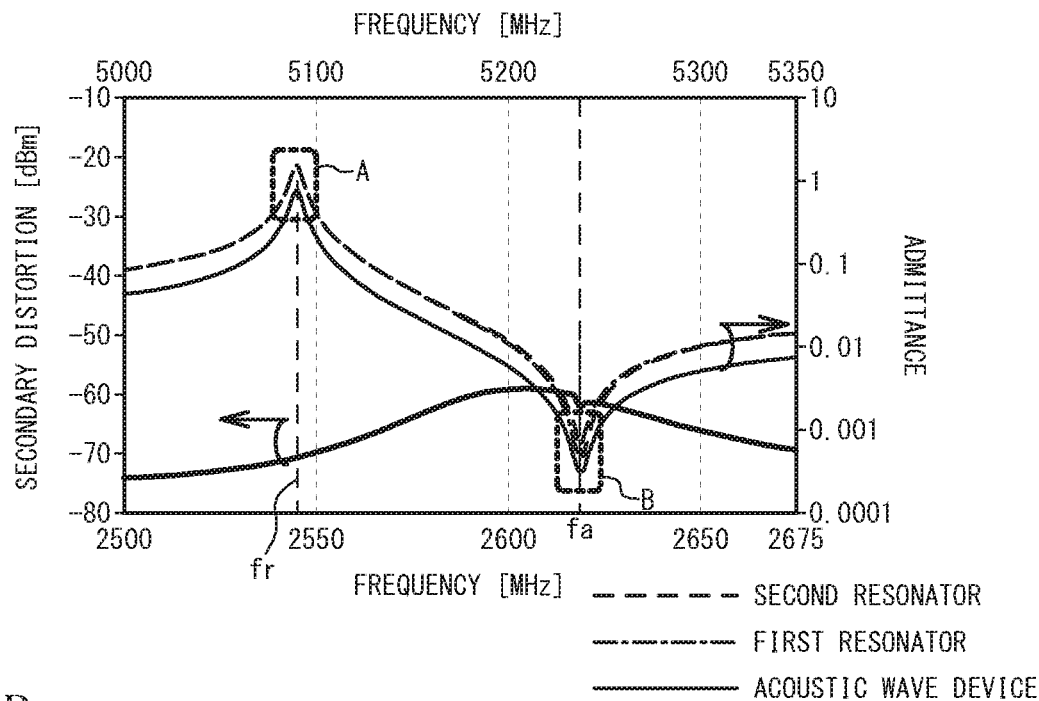
FIG. 11A illustrates simulation results of the admittance characteristic and the secondary distortion characteristic of the acoustic wave device in accordance with the first embodiment.
Figure 11B:
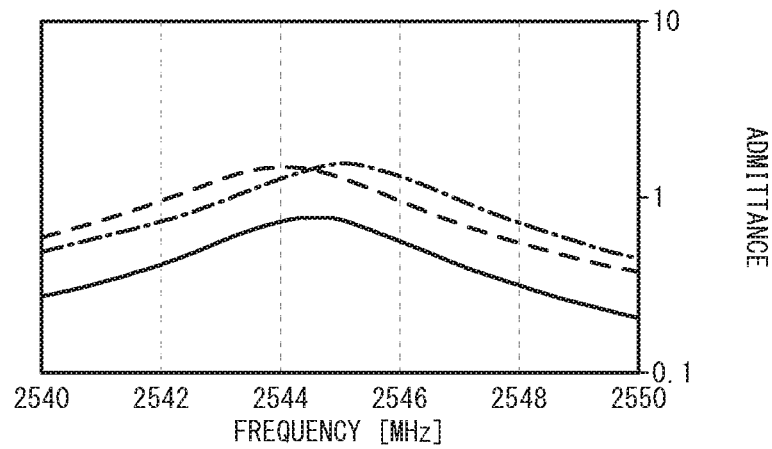
FIG. 11B is an enlarged view of the region A in FIG. 11A.
Figure 11C:
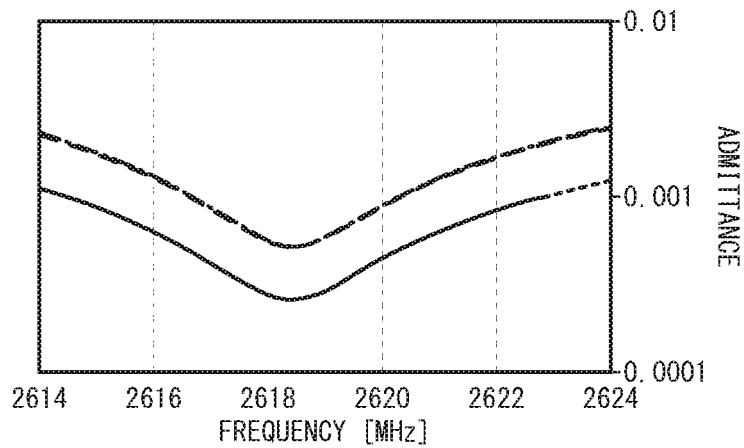
FIG. 11C is an enlarged view of the region B in FIG. 11A.

FIG. 11A illustrates simulation results of the admittance characteristic and the secondary distortion characteristic of the acoustic wave device 100 in accordance with the first embodiment. FIG. 11B is an enlarged view of the region A around the resonant frequency fr in FIG. 11A, and FIG. 11C is an enlarged view of the region B around the antiresonant frequency fa in FIG. 11A. The lower horizontal axis in FIG. 11A represents the frequency (MHz) of the admittance characteristic, the upper horizontal axis represents the frequency (MHz) of the secondary distortion characteristic, the right vertical axis represents admittance, and the left vertical axis represents secondary distortion (dBm). The horizontal axis in FIG. 11B and FIG. 11C represents frequency (MHz), and the vertical axis represents admittance. Dotted lines indicate the admittance characteristic of the second resonator 20, chain lines indicate the admittance characteristic of the first resonator 10 to which the floating capacitance was connected, and thin solid lines indicate the admittance characteristic of the acoustic wave device 100.

As illustrated in FIG. 11A, in the acoustic wave device 100 of the first embodiment, the local deterioration of the secondary distortion at around the antiresonant frequency was reduced. This is considered because harmonics were well canceled out between the first resonator 10 and the second resonator 20 by adjusting the coverage of the mass load film 38 of the second resonator 20 so that the antiresonant frequency of the first resonator 10 to which the floating capacitance was connected was approximately equal to the antiresonant frequency of the second resonator 20 as illustrated in FIG. 11C. In addition, since the frequency was adjusted by the mass load film 38, as illustrated in FIG. 11B, the resonant frequency of the second resonator 20 shifted to a frequency lower than the resonant frequency of the first resonator 10. However, since the secondary distortion at around the resonant frequency is relatively small, even when the resonant frequency shifts a little, little problem arises.

FIG. 11A through FIG. 11C illustrate simulation results when the floating capacitance between the wiring line and a ground is 0.03 pF and the antiresonant frequency of the second resonator 20 is 1.058 MHz lower than that of the first resonator 10. In this case, the secondary distortion was well reduced. Thus, a simulation was conducted to verify how much the antiresonant frequency of the second resonator 20 is to be changed with respect to the antiresonant frequency of the first resonator 10 to reduce the secondary distortion well when the floating capacitance generated between the wiring line and a ground is varied.

Figure 12:
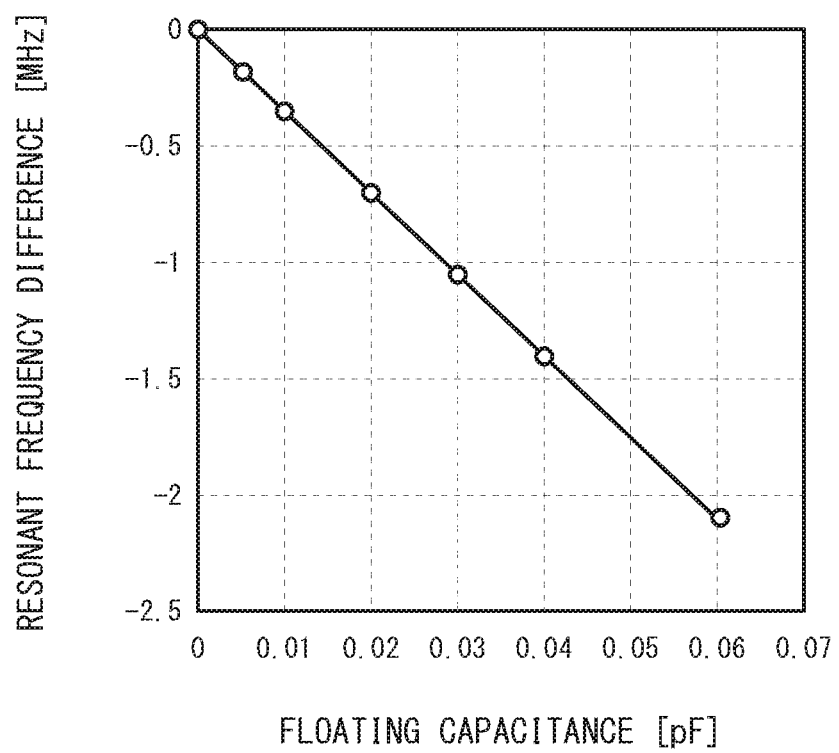
FIG. 12 illustrates simulation results indicating a relationship between a floating capacitance and a difference in resonant frequency when secondary distortion can be well reduced.

FIG. 12 illustrates simulation results indicating the relationship between the magnitude of the floating capacitance and the resonant frequency difference when the secondary distortion can be well reduced. The horizontal axis in FIG. 12 represents the magnitude of the floating capacitance. The vertical axis represents the resonant frequency difference between the second resonator 20 and the first resonator 10. That is, the vertical axis represents δf of fr2=fr1+δf where fr2 represents the resonant frequency of the second resonator 20 and fr1 represents the antiresonant frequency of the first resonator 10. As illustrated in FIG. 12, the secondary distortion was reduced well by making the resonant frequency of the second resonator 20 lower than that of the first resonator 10 with the increase in the floating capacitance.

As described above, in the first embodiment, the first resonator 10 and the second resonator 20 are connected in series so that the electrode of the first resonator 10 in the c-axis orientation direction of the piezoelectric substance 34 of the first resonator 10 has an electric potential identical to the electric potential of the electrode of the second resonator 20 in the c-axis orientation direction of the piezoelectric substance 34 of the second resonator 20. The second resonator 20 located closer to a terminal to which signals are input has an antiresonant frequency lower than that of the first resonator 10 located closer to a terminal from which signals are output. This structure can reduce the difference between the antiresonant frequency of the first resonator 10 to which the floating capacitance between the wiring line and a ground is connected and the antiresonant frequency of the second resonator 20 as described in FIG. 11A through FIG. 11C. As a result, harmonics are well canceled out between the first resonator 10 and the second resonator 20, and the secondary distortion can be well reduced.

In addition, in the first embodiment, the second resonator 20 includes the mass load film 38 in the resonance region 44, while the first resonator 10 does not include the mass load film 38 in the resonance region 44. Thus, the coverage of the mass load film 38 (the ratio of the total area of the mass load film to the area of the resonance region) in the second resonator 20 is greater than that in the first resonator 10. As described in FIG. 10, this structure can make the antiresonant frequency of the second resonator 20 lower than that of the first resonator 10. The first embodiment has described an exemplary case where the mass load film 38 is not located in the resonance region 44 of the first resonator 10, but the mass load film 38 with the same thickness as the mass load film 38 of the second resonator 20 may be located in the resonance region 44 of the first resonator 10. Even in this case, by making the coverage of the mass load film 38 of the second resonator 20 greater than that of the first resonator 10, the antiresonant frequency of the second resonator 20 can be made to be lower than that of the first resonator 10. That is, the mass load film 38 is only required to be located in at least the second resonator 20.

Figure 13A:
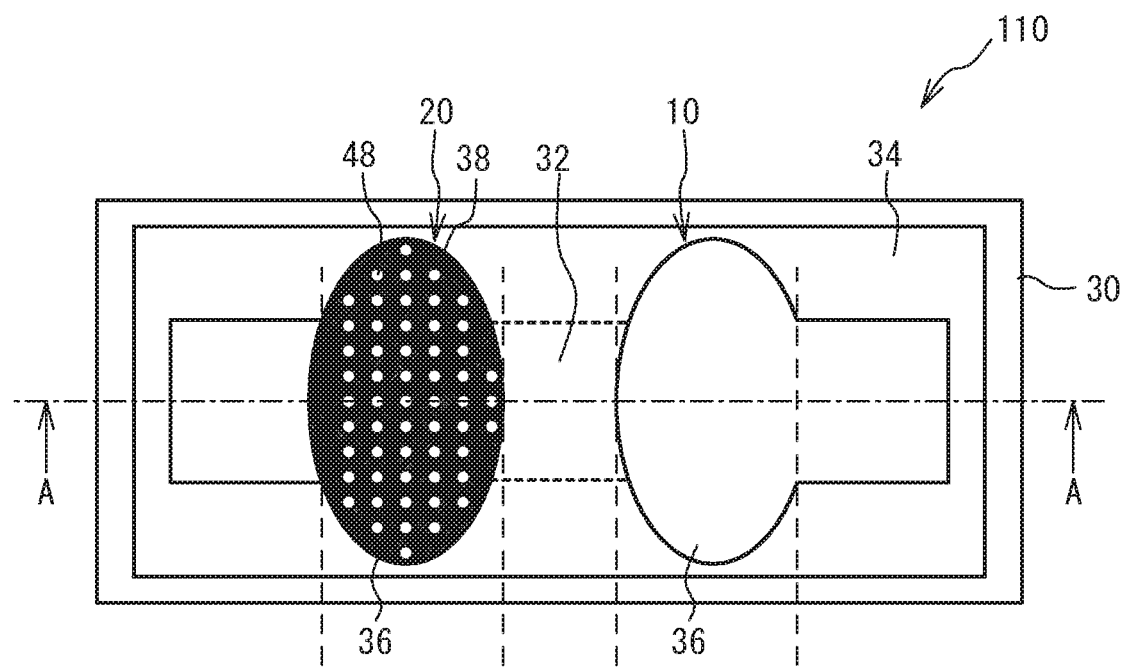
FIG. 13A is a plan view of an acoustic wave device in accordance with a first variation of the first embodiment.
Figure 13B:
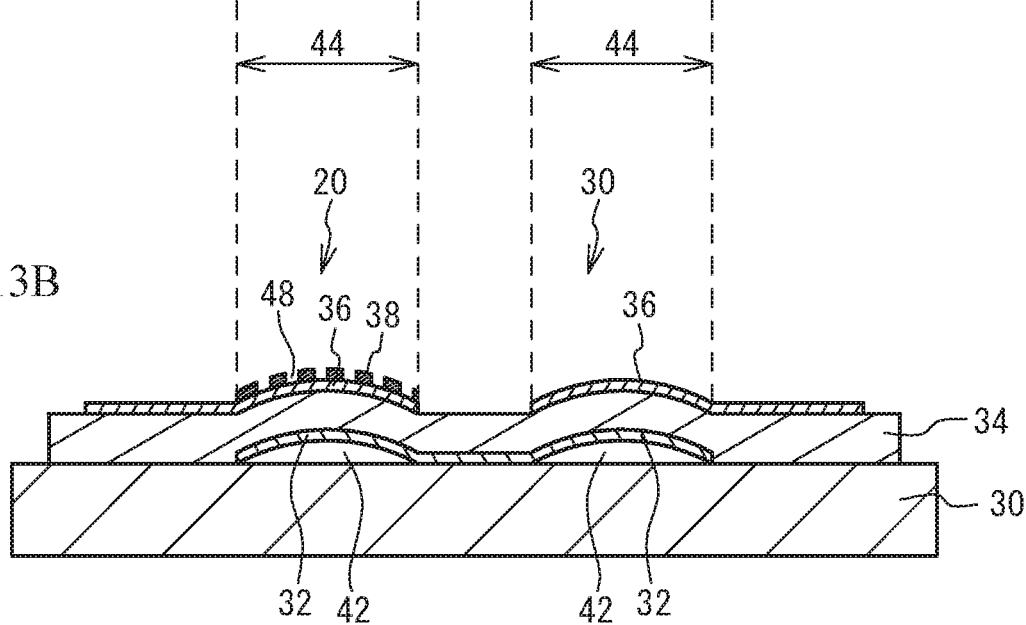
FIG. 13B is a cross-sectional view taken along line A-A in FIG. 13A.

In the first embodiment, instead of the island-shaped patterns 46, opening patterns may be formed in the mass load film 38. FIG. 13A is a plan view of an acoustic wave device 110 in accordance with a first variation of the first embodiment, and FIG. 13B is a cross-sectional view taken along line A-A in FIG. 13A. As illustrated in FIG. 13A and FIG. 13B, in the acoustic wave device 110 of the first variation of the first embodiment, the mass load film 38 has opening patterns 48. The opening patterns 48 may have the same dimensions or different dimensions as viewed from above. The opening patterns 48 may be arranged at regular intervals or at irregular intervals. The shapes of the opening patterns 48 are not limited to a circular shape as viewed from above, and may be other shapes such as a rectangular shape or an elliptical shape.

The first embodiment and the first variation thereof have described an exemplary case where the lower electrodes 32 of the first and second resonators 10 and 20 are coupled to each other, but the upper electrodes 36 may be coupled to each other as in FIG. 7A and FIG. 7B.

The first embodiment has described an exemplary case where the mass load film 38 is located on the upper electrode 36, but does not intend to suggest any limitation. The mass load film 38 may be located under the lower electrode 32, in the film of the lower electrode 32, between the lower electrode 32 and the piezoelectric substance 34, between the piezoelectric substance 34 and the upper electrode 36, or in the film of the upper electrode 36 as long as the mass load film 38 is located within the resonance region 44.

The first embodiment and the first variation thereof have described an exemplary case where the antiresonant frequencies are changed by making the coverage of the mass load film 38 different between the first resonator 10 and the second resonator 20, but the antiresonant frequencies may be changed by making the thickness of the mass load film 38 different.

Second Embodiment

Figure 14A:
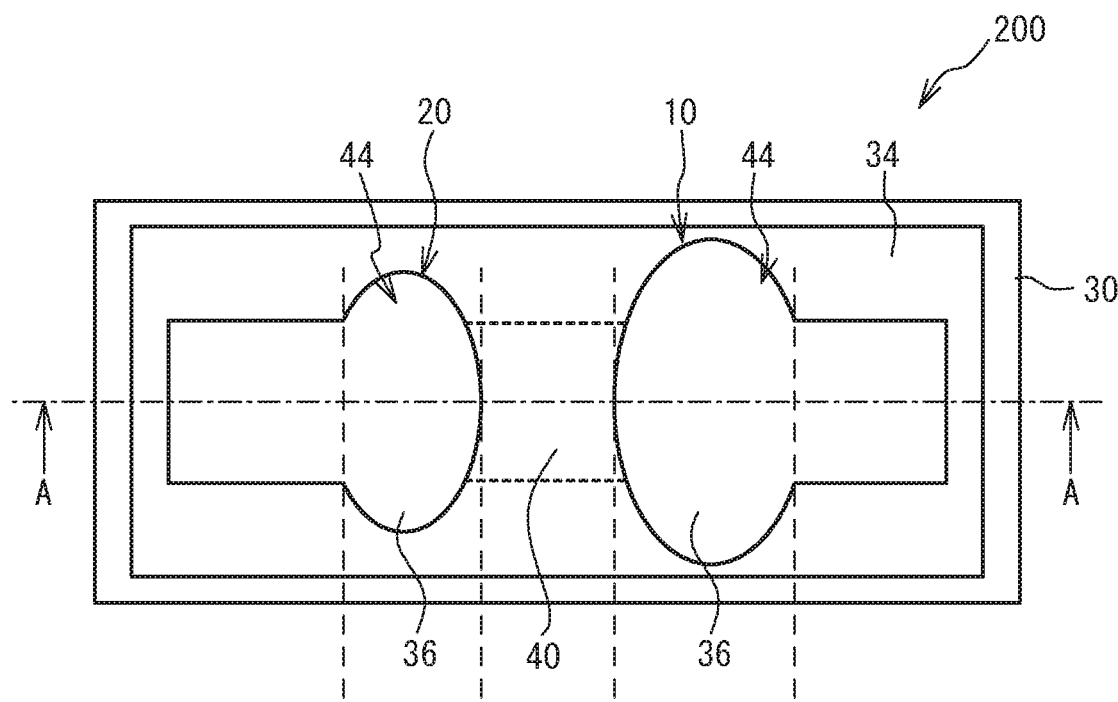
FIG. 14A is a plan view of an acoustic wave device in accordance with a second embodiment.
Figure 14B:
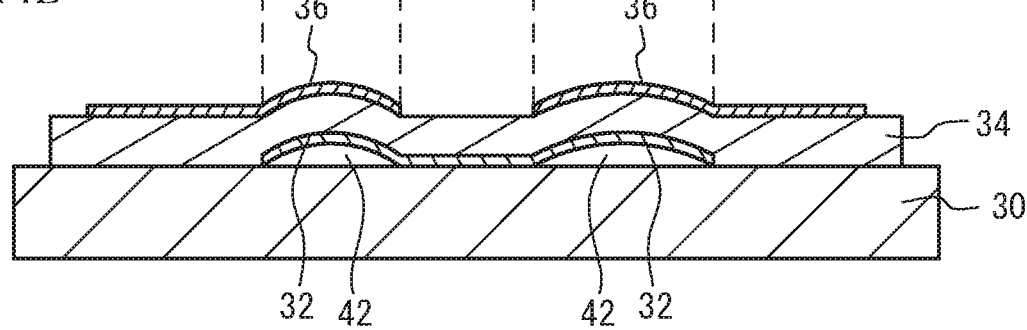
FIG. 14B is a cross-sectional view taken along line A-A in FIG. 14A.

FIG. 14A is a plan view of an acoustic wave device 200 in accordance with a second embodiment, and FIG. 14B is a cross-sectional view taken along line A-A in FIG. 14A. As illustrated in FIG. 14A and FIG. 14B, in the acoustic wave device 200 of the second embodiment, none of the first resonator 10 and the second resonator 20 includes the mass load film 38. The area of the resonance region 44 of the second resonator 20 is less than that of the first resonator 10. Other structures are the same as those of the first embodiment, and the description thereof is thus omitted.

In the second embodiment, the area of the resonance region 44 of the second resonator 20 is less than that of the first resonator 10. The area of the resonance region correlates with the electromechanical coupling coefficient, and as the area of the resonance region increases, the electromechanical coupling coefficient increases. Therefore, in the second embodiment, the electromechanical coupling coefficient of the second resonator 20 is less than that of the first resonator 10.

Here, a simulation was conducted on the acoustic wave device 200 of the second embodiment of which the area of the resonance region 44 was adjusted so that the electromechanical coupling coefficient of the second resonator 20 was 0.986 times of the electromechanical coupling coefficient of the first resonator 10. In the simulation, both the first resonator 10 and the second resonator 20 were assumed to have a resonant frequency of 2545 MHz and an electrostatic capacitance of 2 pF, the electromechanical coupling coefficient of the first resonator 10 was set to 6.596%, and the electromechanical coupling coefficient of the second resonator 20 was set to (6.596×0.986)%. The floating capacitance generated between the wiring line between the first resonator 10 and the second resonator 20 and a ground was set to 0.03 pF.

Figure 15A:
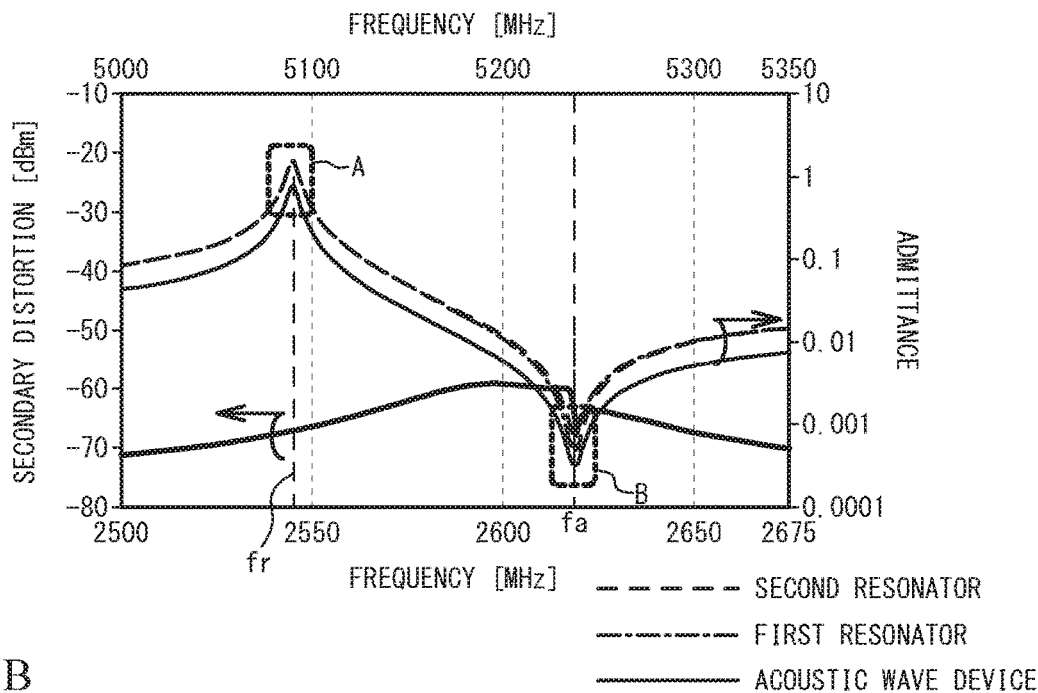
FIG. 15A illustrates simulation results of the admittance characteristic and the secondary distortion characteristic of the acoustic wave device in accordance with the second embodiment.
Figure 15B:
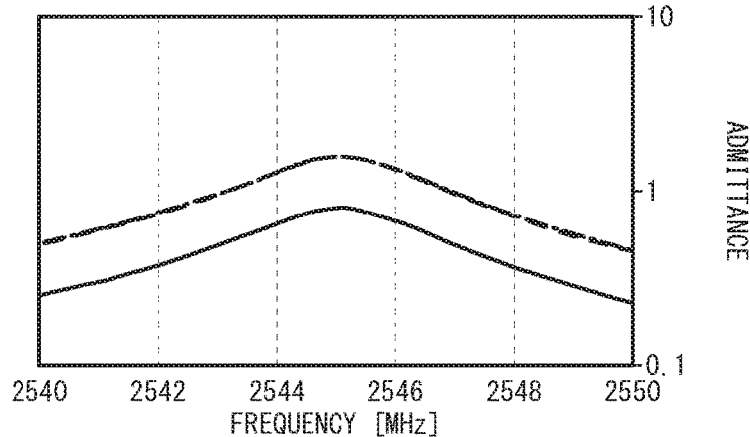
FIG. 15B is an enlarged view of the region A in FIG. 15A.
Figure 15C:
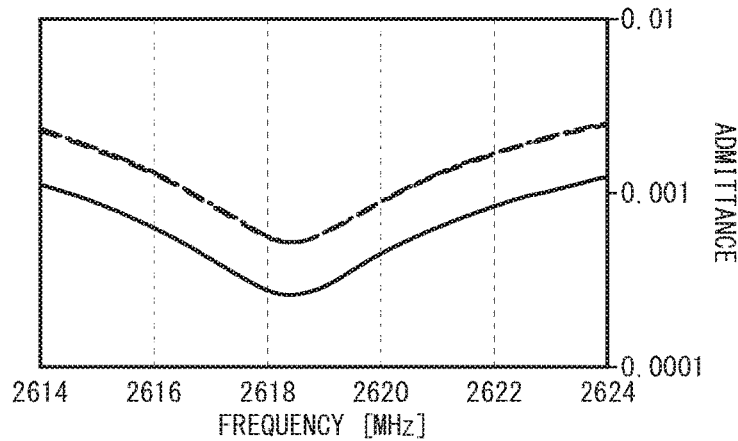
FIG. 15C is an enlarged view of the region B in FIG. 15A.

FIG. 15A illustrates simulation results of the admittance characteristic and the secondary distortion characteristic of the acoustic wave device 200 in accordance with the second embodiment. FIG. 15B is an enlarged view of the region A around the resonant frequency fr in FIG. 15A, and FIG. 15C is an enlarged view of the region B around the antiresonant frequency fa in FIG. 15A. The lower horizontal axis in FIG. 15A represents the frequency (MHz) of the admittance characteristic, the upper horizontal axis represents the frequency (MHz) of the secondary distortion characteristic, the right vertical axis represents admittance, and the left vertical axis represents secondary distortion (dBm). The horizontal axis in FIG. 15B and FIG. 15C represents frequency (MHz), and the vertical axis represents admittance. Dotted lines indicate the admittance characteristic of the second resonator 20, chain lines indicate the admittance characteristic of the first resonator 10 to which the floating capacitance is connected, and thin solid lines indicate the admittance characteristic of the acoustic wave device 200.

As illustrated in FIG. 15C, by making the electromechanical coupling coefficient of the second resonator 20 less than that of the first resonator 10, the antiresonant frequencies of the first and second resonators 10 and 20 became approximately the same. Accordingly, as illustrated in FIG. 15A, the local deterioration of the secondary distortion at around the antiresonant frequency was reduced. In addition, when the antiresonant frequency of the second resonator 20 was lowered by the electromechanical coupling coefficient, the resonant frequencies became approximately the same as illustrated in FIG. 15B.

Figure 16:
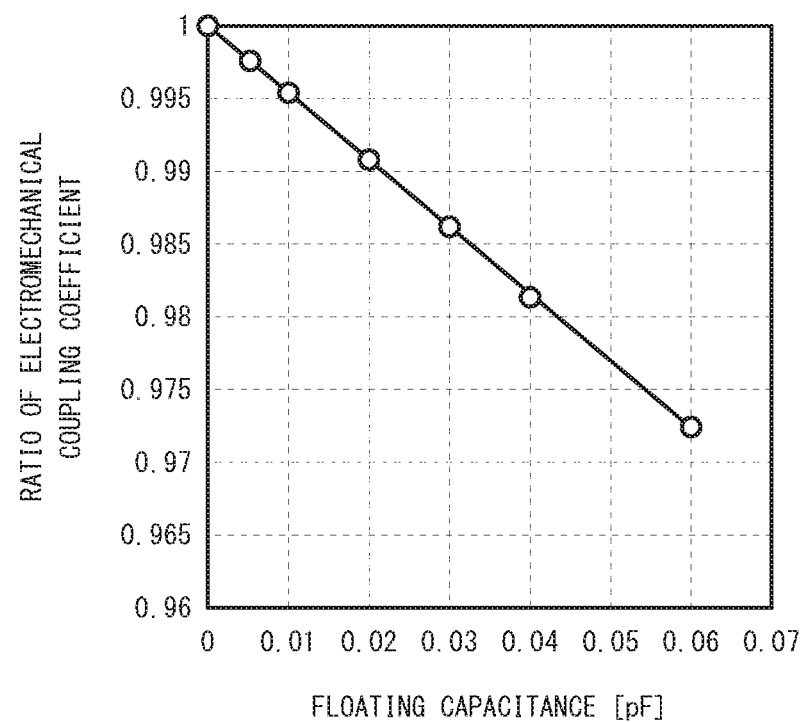
FIG. 16 illustrates simulation results indicating a relationship between a floating capacitance and a ratio of the electromechanical coupling coefficient of a second resonator to the electromechanical coupling coefficient of a first resonator when secondary distortion is well reduced.

A simulation was conducted to examine how much greater the electromechanical coupling coefficient of the second resonator 20 is to be than that of the first resonator 10 to reduce the secondary distortion well when the floating capacitance generated between the wiring line and a ground is varied. FIG. 16 illustrates simulation results indicating the relationship between the magnitude of the floating capacitance and the ratio of the electromechanical coupling coefficient of the second resonator 20 to the electromechanical coupling coefficient of the first resonator 10 when the secondary distortion can be well reduced. The horizontal axis in FIG. 16 represents the magnitude of the floating capacitance. The vertical axis represents the ratio of the electromechanical coupling coefficient of the second resonator 20 to the electromechanical coupling coefficient of the first resonator 10. That is, the vertical axis represents Coeffk$^2$ of k$^2$2=k$^2$1×Coeffk$^2$ where k$^2$2 represents the electromechanical coupling coefficient of the second resonator 20 and k$^2$1 represents the electromechanical coupling coefficient of the first resonator 10. As illustrated in FIG. 16, by making the electromechanical coupling coefficient of the second resonator 20 less than that of the first resonator 10 with the increase in the floating capacitance, the secondary distortion was well reduced.

As described above, in the second embodiment, the electromechanical coupling coefficient of the second resonator 20 is less than that of the first resonator 10. Even in this case, as described in FIG. 15A through FIG. 15C, it is possible to reduce the difference between the antiresonant frequency of the first resonator 10 to which the floating capacitance is connected and the antiresonant frequency of the second resonator 20. As a result, harmonics are well canceled out between the first resonator 10 and the second resonator 20, and the secondary distortion can be well reduced.

In addition, when the electromechanical coupling coefficient of the second resonator 20 is made to be less than that of the first resonator 10, as illustrated in FIG. 15B and FIG. 15C, the resonant frequency remains unchanged even when the antiresonant frequency changes. Accordingly, both the difference in resonant frequency and the difference in antiresonant frequency can be reduced between the first resonator 10 and the second resonator 20.

In addition, in the second embodiment, the area of the resonance region 44 of the second resonator 20 is less than that of the first resonator 10. This structure allows the electromechanical coupling coefficient of the second resonator 20 to be less than that of the first resonator 10.

Figure 17A:
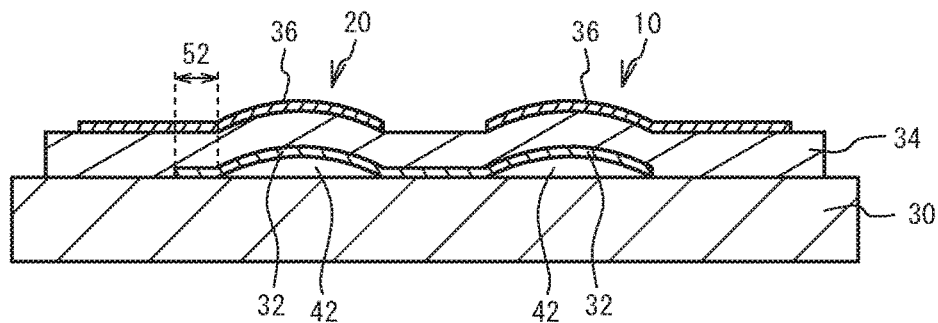
FIG. 17A through FIG. 17E are cross-sectional views illustrating other examples for making the electromechanical coupling coefficient of the second resonator less.
Figure 17B:
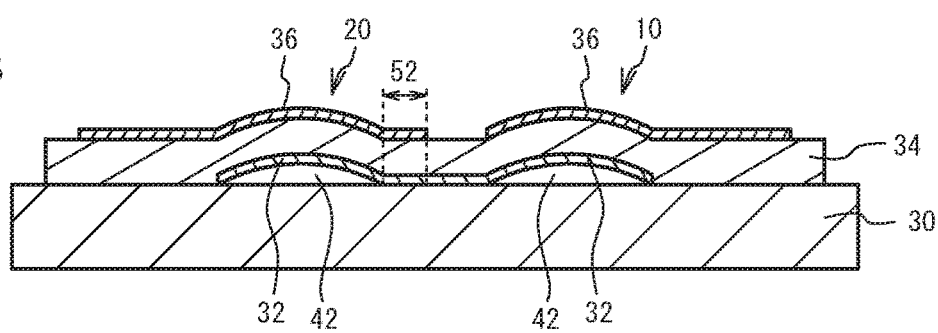
Figure 17C:
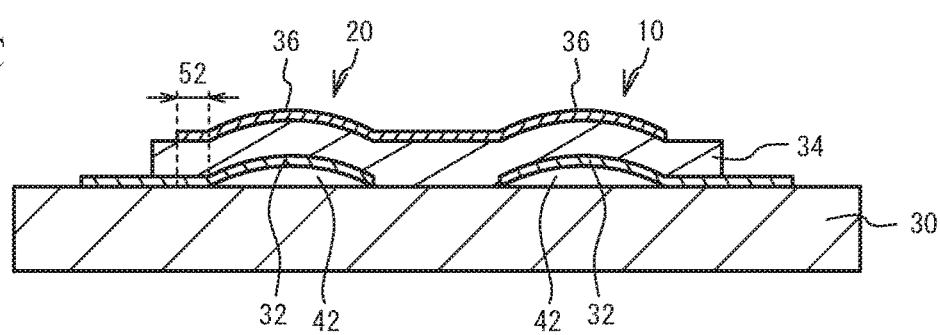
Figure 17D:
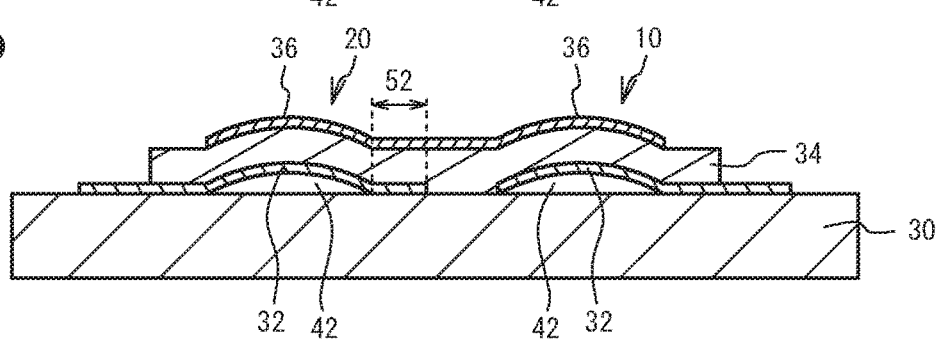
Figure 17E:
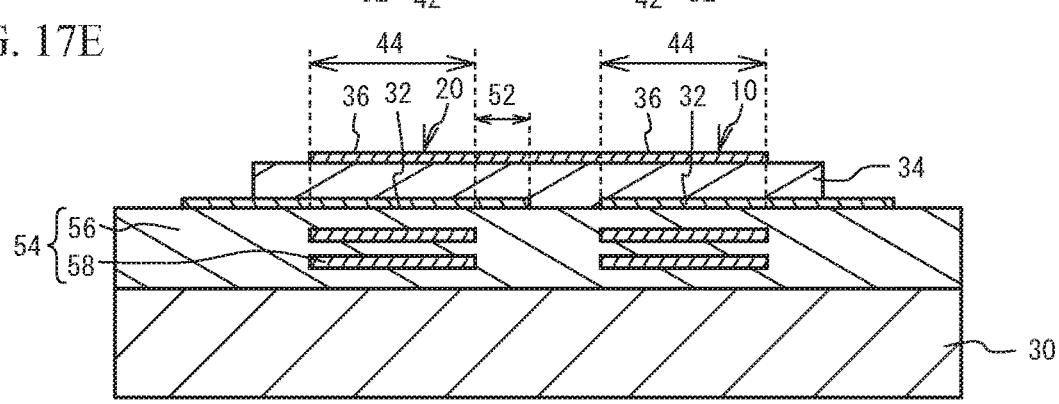

The second embodiment has described an exemplary case where the electromechanical coupling coefficient is made to be less by making the area of the resonance region 44 of the second resonator 20 less than that of the first resonator 10, but the electromechanical coupling coefficient may be made to be less by other methods. FIG. 17A through FIG. 17E are cross-sectional views illustrating other examples for making the electromechanical coupling coefficient of the second resonator 20 less. FIG. 17A and FIG. 17B illustrate exemplary cases where the lower electrodes 32 of the first and second resonators 10 and 20 are coupled to each other, and FIG. 17C through FIG. 17E illustrate exemplary cases where the upper electrodes 36 are coupled to each other.

In FIG. 17A, the lower electrode 32 of the second resonator 20 extends so as to face the upper electrode 36 across the piezoelectric substance 34 in other than the resonance region 44. In FIG. 17B, the upper electrode 36 of the second resonator 20 extends so as to face the lower electrode 32 across the piezoelectric substance 34 in other than the resonance region 44. In FIG. 17C, the upper electrode 36 of the second resonator 20 extends so as to face the lower electrode 32 across the piezoelectric substance 34 in other than the resonance region 44. In FIG. 17D, the lower electrode 32 of the second resonator 20 extends so as to face the upper electrode 36 across the piezoelectric substance 34 in other than the resonance region 44. In FIG. 17E, the air gap 42 is not formed between the substrate 30 and the lower electrode 32, and an acoustic mirror 54 is formed under the lower electrode 32 instead. The acoustic mirror 54 is a film configured to reflect the acoustic wave propagating through the piezoelectric substance 34, and is formed of a film 56 with low acoustic impedance and a film 58 with high acoustic impedance alternately stacked. A region where the lower electrode 32 and the upper electrode 36 face each other across the piezoelectric substance 34 above the acoustic mirror 54 forms the resonance region 44. The lower electrode 32 of the second resonator 20 extends so as to face the upper electrode 36 across the piezoelectric substance 34 in other than the resonance region 44.

In FIG. 17A through FIG. 17E, a region 52 where the lower electrode 32 and the upper electrode 36 face each other across the piezoelectric substance 34 in other than the resonance region 44 is a non-resonance region in which the piezo vibration is not performed because the region 52 is not located above the air gap 42 or the acoustic mirror 54. The region 52 has an electrostatic capacitance because the lower electrode 32 and the upper electrode 36 face each other across the piezoelectric substance 34.

Here, the electrostatic capacitance of the piezoelectric thin film resonator is represented by C0, a damping capacitance relating to piezo vibration is represented by C1, and the ratio of the electrostatic capacitance C0 to the damping capacitance C1 is represented by Γ. That is, Γ=C0/C1. In this case, the electromechanical coupling coefficient $k^2$ of the piezoelectric thin film resonator can be represented by the following equation 1.

$$k^2[\%] = \left(\frac{\pi^2}{4}\right)\left\{\sqrt{\frac{\Gamma}{\Gamma+1}} - \frac{\Gamma}{\Gamma+1}\right\} \times 100 \quad (1)$$

Figure 18:
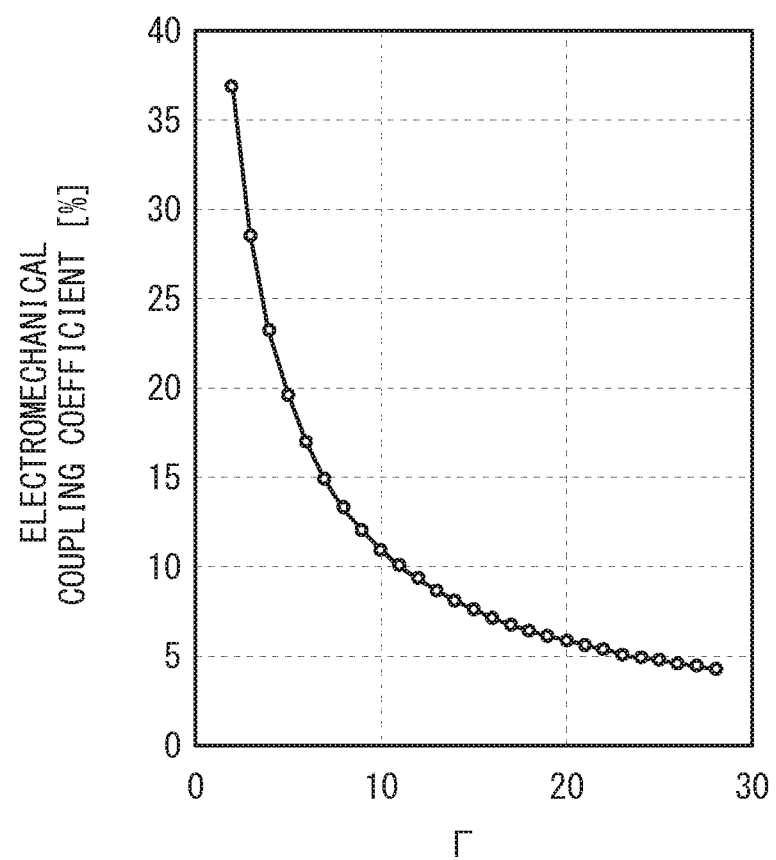
FIG. 18 illustrates simulation results indicating a relationship between F, which is a ratio of an electrostatic capacitance and a damping capacitance, and an electromechanical coupling coefficient.

FIG. 18 illustrates simulation results indicating the relationship between Γ, which is the ratio of the electrostatic capacitance to the damping capacitance, and the electromechanical coupling coefficient. FIG. 18 reveals that as Γ increases, the electromechanical coupling coefficient decreases.

Since the region 52 forms the electrostatic capacitance C0, if the area of the resonance region 44 is constant, the damping capacitance C1 is constant. Therefore, as the region 52 increases, Γ, which is the ratio of the electrostatic capacitance C0 to the damping capacitance C1, increases. That is, the electromechanical coupling coefficient decreases. In FIG. 17A through FIG. 17E, since the region 52 is formed in the second resonator 20, the electromechanical coupling coefficient of the second resonator 20 is less than that of the first resonator 10.

As described in FIG. 17A through FIG. 17E, the electromechanical coupling coefficient of the second resonator 20 can be also made to be less than that of the first resonator 10 by making the region 52 of the second resonator 20 greater than that of the first resonator 10. FIG. 17A through FIG. 17E illustrate exemplary cases where the region 52 in which the lower electrode 32 and the upper electrode 36 face each other across the piezoelectric substance 34 in other than the resonance region 44 is not formed in the first resonator 10, but the region 52 with a smaller area than that of the second resonator 20 may be formed.

Third Embodiment

Figure 19:
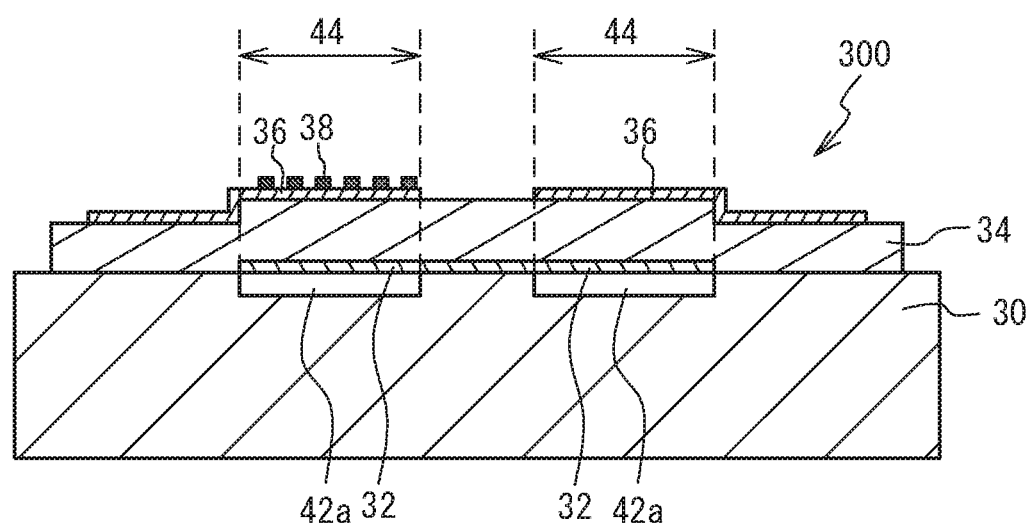
FIG. 19 is a cross-sectional view of an acoustic wave device in accordance with a third embodiment.

FIG. 19 is a cross-sectional view of an acoustic wave device 300 in accordance with a third embodiment. As illustrated in FIG. 19, the acoustic wave device 300 of the third embodiment includes a recess formed on the principal surface of the substrate 30. The lower electrode 32 is approximately flatly formed on the principal surface of the substrate 30. This structure causes the recess of the substrate 30 to function as an air gap 42a. The air gap 42a is formed so as to include the resonance region 44. Other structures are the same as those of the acoustic wave device 100 of the first embodiment, and the description thereof is thus omitted. The air gap 42a may be formed so as to penetrate through the substrate 30.

Fourth Embodiment

Figure 20:
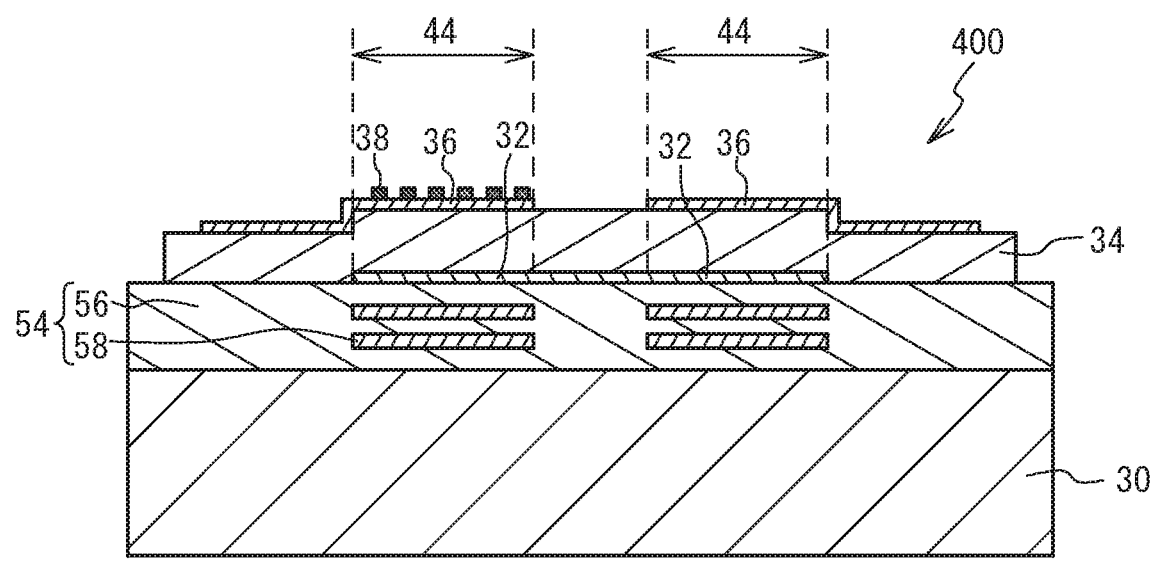
FIG. 20 is a cross-sectional view of an acoustic wave device in accordance with a fourth embodiment.

FIG. 20 is a cross-sectional view of an acoustic wave device 400 in accordance with a fourth embodiment. As illustrated in FIG. 20, the acoustic wave device 400 of the fourth embodiment includes the acoustic mirror 54 formed under the lower electrode 32 in the resonance region 44. The acoustic mirror 54 is a film configured to reflect an acoustic wave propagating through the piezoelectric substance 34, and is formed of the film 56 with low acoustic impedance and the film 58 with high acoustic impedance alternately stacked. The film thickness of each of the film 56 with low acoustic impedance and the film 58 with high acoustic impedance is basically λ/4 (λ is the wavelength of the acoustic wave), but may be appropriately changed to achieve desired characteristics. In addition, the stacking number of the film 56 with low acoustic impedance and the film 58 with high acoustic impedance can be freely selected. Other structures are the same as those of the acoustic wave device 100 of the first embodiment, and the description thereof is thus omitted.

As described above, the piezoelectric thin film resonator may be a Film Bulk Acoustic Resonator (FBAR) in which the air gap 42 or 42a is located between the lower electrode 32 and the substrate 30 in the resonance region 44, or a Solidly Mounted Resonator (SMR) in which the acoustic mirror 54 is located under the lower electrode 32 in the resonance region 44.

The first through fourth embodiments have described exemplary piezoelectric thin film resonators that use MN as the piezoelectric substance 34, but the piezoelectric substance 34 may be ZnO or other piezoelectric materials. When other piezoelectric materials are used, the c-axis orientation may be replaced by a polarization axis to reduce the secondary distortion well as in the first through fourth embodiments.

Fifth Embodiment

Figure 21:
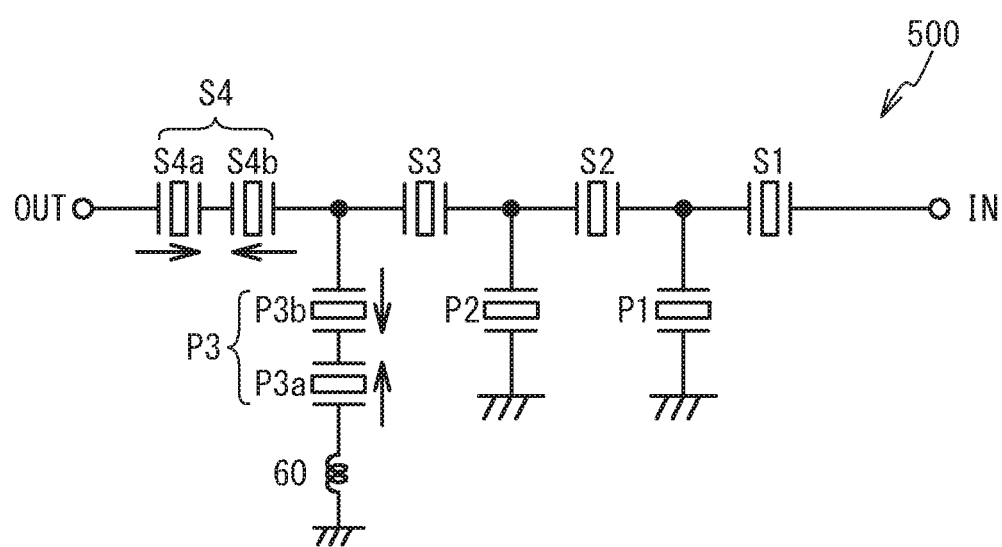
FIG. 21 illustrates a ladder-type filter in accordance with a fifth embodiment.

FIG. 21 illustrates a ladder-type filter 500 in accordance with a fifth embodiment. As illustrated in FIG. 21, the ladder-type filter 500 of the fifth embodiment includes one or more series resonators S1 through S4 connected in series and one or more parallel resonators P1 through P3 connected in parallel between the input terminal IN and the output terminal OUT. The series resonator S4 is divided into a first resonator S4a and a second resonator S4b, and the parallel resonator P3 is divided into a first resonator P3a and a second resonator P3b. The first and second resonators S4a and S4b are connected in series so that the electrode of the first resonator S4a in the c-axis orientation direction of the piezoelectric substance of the first resonator S4a has an electric potential identical to the electric potential of the electrode of the second resonator S4b in the c-axis orientation of the piezoelectric substance of the second resonator S4b. Similarly, the first resonator P3a and the second resonator P3b are connected in series so that the electrode of the first resonator P3a in the c-axis orientation direction of the piezoelectric substance of the first resonator P3a has an electric potential identical to the electric potential of the electrode of the second resonator P3b in the c-axis orientation direction of the piezoelectric substance of the second resonator P3b.

An inductor 60 is connected between the parallel resonator P3 and a ground. An attenuation pole formed by the parallel resonator P3 to which the inductor 60 is coupled is located in a frequency band corresponding to twice the passband of the ladder-type filter 500. The inductance L of the inductor 60 is calculated by the equation 2. In the equation 2, f represents a frequency corresponding to twice the passband, and C represents the electrostatic capacitance of the parallel resonator P3.

$$L = \frac{1}{f} \cdot \frac{1}{(2\pi)^2 C} \quad (2)$$

Here, a description will be given of a simulation of the secondary distortion characteristic conducted on the ladder-type filter 500 of the fifth embodiment. The simulation was conducted as follows. The passband of the ladder-type filter was set to 2500 MHz to 2570 MHz, a power of 28 dBm was input to the input terminal IN, and an output power of 5000 MHz to 5140 MHz was measured at the output terminal OUT. Table 2 lists the capacitance values and the resonant frequencies of the series resonators S1 through S4 and the parallel resonators P1 through P3. In addition, the floating capacitance C1 between the wiring line between the first resonator S4a and the second resonator S4b and a ground was set to 0.03 pF, and the floating capacitance C2 between the wiring line between the first resonator P3a and the second resonator P3b and a ground wiring line was set to 0.03 pF.

TABLE 2

|  | S1 | S2 | S3 | S4 | P1 | P2 | P3 |
|---|---|---|---|---|---|---|---|
| Capacitance value [pF] | 1.392 | 0.748 | 0.748 | 0.745 | 2.603 | 0.869 | 2.093 |
| Resonant frequency [GHz] | 2.533 | 2.549 | 2.543 | 2.544 | 2.460 | 2.479 | 2.460 |

The resonant frequencies of the first and second resonators S4a and S4b were set to the same resonant frequency as the series resonator S4 before division, and the capacitance values were set to twice the capacitance value of the series resonator S4 before division. On the other hand, the resonant frequencies and the capacitance values of the first and second resonators P3a and P3b were configured in accordance with the following two conditions.

First condition: The resonant frequency of the first resonator P3a was set to the same resonant frequency as the parallel resonator P3 before division, and the resonant frequency of the second resonator P3b was made to be 0.33 MHz less than that of the first resonator P3a. The capacitance values of the first and second resonators P3a and P3b were set to twice the capacitance value of the parallel resonator P3 before division.

Second condition: The resonant frequencies of the first and second resonators P3a and P3b were set to the same resonant frequency as the parallel resonator P3 before division. The capacitance value of the first resonator P3a was set to the same capacitance value as the parallel resonator P3 before division, and the capacitance value of the second resonator P3b was set to 0.975 times of the capacitance value of the first resonator P3a.

Figure 22:
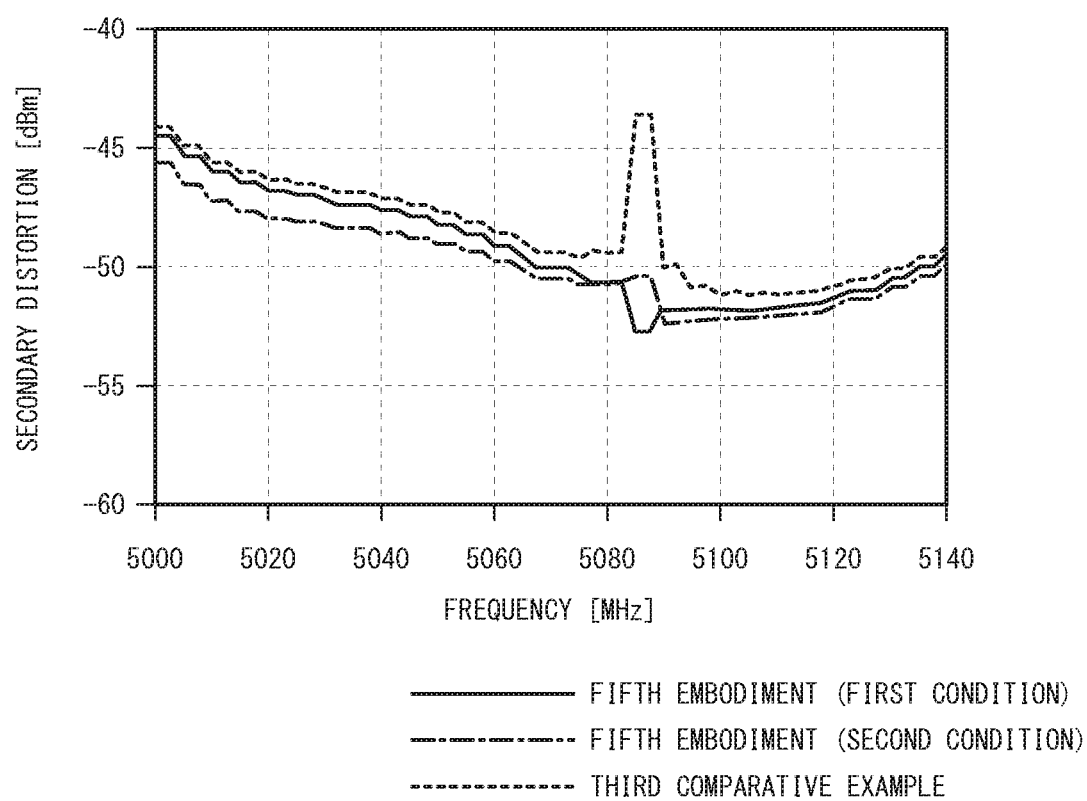
FIG. 22 illustrates simulation results of the secondary distortion characteristic of the ladder-type filter in accordance with the fifth embodiment.

FIG. 22 illustrates simulation results of the secondary distortion characteristic of the ladder-type filter 500 in accordance with the fifth embodiment. The horizontal axis in FIG. 22 represents frequency (MHz), and the vertical axis represents secondary distortion (dBm). The solid line indicates the simulation result of the ladder-type filter 500 of the fifth embodiment under the first condition, and the chain line indicates the simulation result of the ladder-type filter 500 of the fifth embodiment under the second condition. For comparison, the dotted line indicates the simulation result of a ladder-type filter of a third comparative example of which the structure is the same as that of the fifth embodiment except that the resonant frequencies of the first and second resonators P3a and P3b were set to the same resonant frequency as the parallel resonator P3 before division, and the capacitance values were set to twice the capacitance value of the parallel resonator P3 before division.

As illustrated in FIG. 22, in the third comparative example, the secondary distortion locally deteriorated. This deterioration is considered to be due to the effect of the floating capacitance C2 between the wiring line between the first resonator P3a and the second resonator P3b and a ground. Although the floating capacitance C1 is also generated between the wiring line between the first resonator S4a and the second resonator S4b and a ground, the frequency at which the secondary distortion locally deteriorates is in a frequency region twice the frequency higher than the passband of the ladder-type filter, and therefore, no problem arises.

In contrast, in the fifth embodiment, the secondary distortion was well reduced. This is considered because the effect of the floating capacitance C2 was reduced by making the resonant frequency of the second resonator P3b lower than the resonant frequency of the first resonator P3a and making the capacitance value of the second resonator P3b less than the capacitance value of the first resonator P3a to make the electromechanical coupling coefficient less.

As described above, in the fifth embodiment, the parallel resonator P3 is divided into the first resonator P3a and the second resonator P3b, and the first resonator 10 and the second resonator 20 of any one of the first through fourth embodiments are used for the first resonator P3a and the second resonator P3b, respectively. This structure can reduce the secondary distortion well. At least one of one or more series resonators S1 through S4 and one or more parallel resonators P1 through P3 may be divided into two resonators, and the first resonator 10 and the second resonator 20 of any one of the first through fourth embodiments may be used for the divided two resonators. Even in this case, the secondary distortion can be well reduced.

In addition, harmonics emitted from the output terminal OUT are mainly composed of harmonics emitted from the series resonator S4 and the parallel resonator P3 closest to the output terminal OUT. Thus, at least one of the series resonator S4, which is located closest to the output terminal OUT among one or more series resonators S1 through S4, and the parallel resonator P3, which is located closest to the output terminal OUT among one or more parallel resonators P1 through P3, is preferably divided into two resonators, and the first resonator 10 and the second resonator 20 of any one of the first through fourth embodiments are preferably used for the divided two resonators. In addition, when a resonator is serially divided, since the resonance region becomes large, the filter chip increases in size, but there are advantages in power durability. Therefore, by serially dividing only the resonator closest to the output terminal OUT, the increase in size can be reduced and the power durability can be improved while the secondary distortion is well reduced.

In addition, in the fifth embodiment, the inductor 60 is connected between the parallel resonator P3, which is located closest to the output terminal OUT among parallel resonators, and a ground, and the attenuation pole formed by the parallel resonator P3 is located in a frequency band corresponding to twice the passband of the ladder-type filter 500. Therefore, the secondary distortion from a resonator located closer to the input terminal than the parallel resonator P3 can be released to a ground, and the large attenuation of harmonic can be obtained.

Sixth Embodiment

Figure 23:
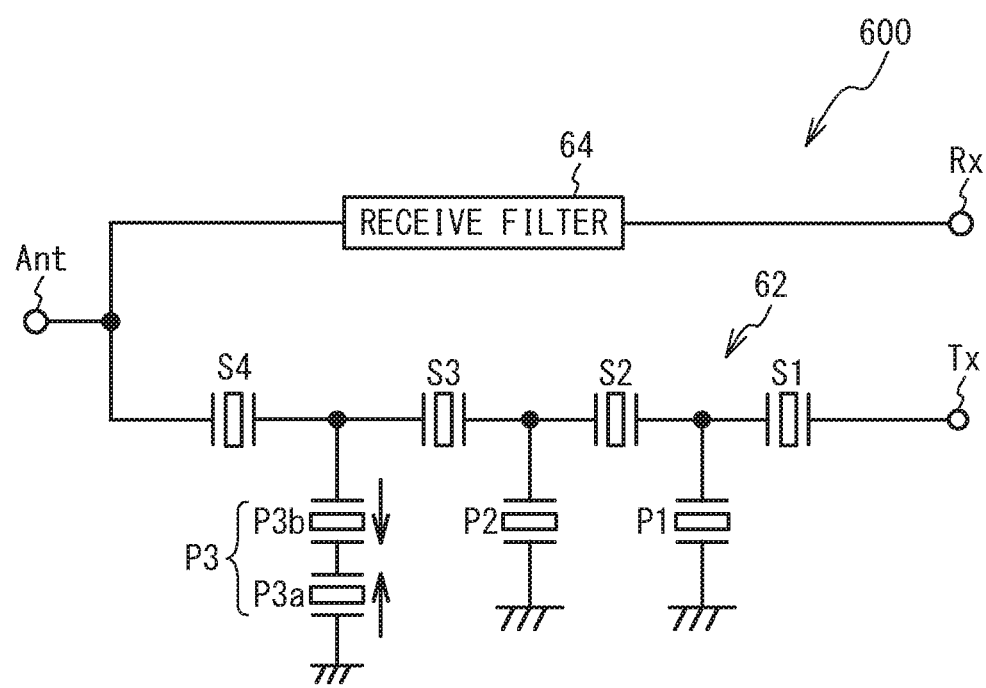
FIG. 23 is a block diagram of a duplexer in accordance with a sixth embodiment.

FIG. 23 is a block diagram of a duplexer 600 in accordance with a sixth embodiment. As illustrated in FIG. 23, the duplexer 600 of the sixth embodiment includes a transmit filter 62 and a receive filter 64. The transmit filter 62 is connected between an antenna terminal Ant and a transmit terminal Tx, and is a ladder-type filter including one or more series resonators S1 through S4 and one or more parallel resonators P1 through P3. The parallel resonator P3 is divided into the first resonator P3a and the second resonator P3b, the first resonator P3a is the first resonator 10 of any one of the first through fourth embodiments, and the second resonator P3b is the second resonator 20 of any one of the first through fourth embodiments. The receive filter 64 is connected between the antenna terminal Ant shared by the transmit filter 62 and the receive terminal Rx.

The transmit filter 62 transmits signals in the transmit band to the antenna terminal Ant as transmission signals among signals input from the transmit terminal Tx, and suppresses signals with other frequencies. The receive filter 64 transmits signals in the receive band to the receive terminal Rx as reception signals among signals input from the antenna terminal Ant, and suppresses signals with other frequencies. The transmit band and the receive band have different frequency bands. A matching circuit for matching impedance so that a transmission signal that has passed through the transmit filter 62 is output from the antenna terminal Ant without leaking to the receive filter 64 may be provided.

In the sixth embodiment, the transmit filter 62 is a ladder-type filter, and the parallel resonator P3, which is located closest to the antenna terminal Ant among one or more parallel resonators P1 through P3, is divided into the first resonator P3a and the second resonator P3b, and the first resonator 10 and the second resonator 20 of any one of the first through fourth embodiments are used for the first resonator P3a and the second resonator P3b. This structure can reduce the secondary distortion well, inhibit the increase in size, and achieve the improvement of power durability.

In the sixth embodiment, at least one of the transmit filter 62 and the receive filter 64 may be a ladder-type filter, at least one of one or more series resonators and one or more parallel resonators of the ladder-type filter may be divided into two resonators, and the first resonator 10 and the second resonator 20 of any one of the first through fourth embodiments may be used for the divided two resonators. Also in this case, the secondary distortion can be reduced well.

Although the embodiments of the present invention have been described in detail, it is to be understood that the various change, substitutions, and alterations could be made hereto without departing from the spirit and scope of the invention.

What is claimed is:

1. A filter comprising:
one or more series resonators connected in series between an input terminal and an output terminal; and
one or more parallel resonators connected in parallel between the input terminal and the output terminal,
wherein at least one of a series resonator located closest to the output terminal among the one or more series resonators and a parallel resonator located closest to the output terminal among the one or more parallel resonators is divided into two resonators,
wherein one of the two resonators is a first resonator and the other of the two resonators is a second resonator that is located closer to the input terminal than the first resonator and is connected in series to the first resonator,
wherein the first resonator includes a first piezoelectric substance, and a first lower electrode and a first upper electrode that sandwich the first piezoelectric substance in a direction of a c-axis orientation or a polarization axis of the first piezoelectric substance,
wherein the second resonator includes a second piezoelectric substance, and a second lower electrode and a second upper electrode that sandwich the second piezoelectric substance so that an electrode of the second resonator in a direction of a c-axis orientation or a polarization axis of the second piezoelectric substance has an electric potential identical to an electric potential of an electrode of the first resonator in the direction of the c-axis orientation or the polarization axis of the first piezoelectric substance,
wherein no resonator other than the first resonator and the second resonator is connected to a wiring line that electrically connects the first resonator and the second resonator in series,
wherein the first resonator includes a first resonance region in which the first lower electrode and the first upper electrode face each other across the first piezoelectric substance above an air gap or an acoustic mirror, and the second resonator includes a second resonance region in which the second lower electrode and the second upper electrode face each other across the second piezoelectric substance above another air gap or another acoustic mirror, so that the first and second resonator both operate in a thickness extension mode,
wherein at least the second resonator of the first resonator and the second resonator includes a mass load film in the second resonance region, the mass load film being distributed uniformly throughout an entire area of the second resonance region and being distributed uniformly throughout an entire area of the first resonance region, if provided in the first resonator, and
wherein a ratio of a total area of the mass load film to an area of the second resonance region in the second resonator is greater than a ratio of a total area of the mass load film to an area of the first resonance region in the first resonator so that the second resonator has an antiresonant frequency less than an antiresonant frequency of the first resonator and has a resonant frequency less than a resonant frequency of the first resonator.

2. The filter according to claim 1, wherein an electromechanical coupling coefficient of the second resonator is less than an electromechanical coupling coefficient of the first resonator.

3. The filter according to claim 2, wherein an area of the second resonance region of the second resonator is less than an area of the first resonance region of the first resonator.

4. The filter according to claim 2, wherein:
an area of the first resonance region of the first resonator is equal to an area of the second resonance region of the second resonator, and
an area of a region where the second lower electrode and the second upper electrode face each other across the second piezoelectric substance in other than the second resonance region of the second resonator and that does not overlap the another air gap or the another acoustic mirror underneath in the plan view is greater than an area of a region where the first lower electrode and the first upper electrode face each other across the first piezoelectric substance in other than the first resonance region of the first resonator and that does not overlap the air gap or the acoustic mirror underneath in the plan view.

5. A duplexer comprising:
a transmit filter connected between an antenna terminal and a transmit terminal; and
a receive filter connected between the antenna terminal and a receive terminal,
wherein at least one of the transmit filter and the receive filter is the filter according to claim 1.

6. The duplexer according to claim 5, wherein:
the transmit filter is the filter according to claim 1, and
the input terminal is the transmit terminal, and the output terminal is the antenna terminal.

7. The filter according to claim 1, wherein only the first resonator and the second resonator are electrically connected to the wiring line.

8. The filter according to claim 1, wherein an area of the first resonance region of the first resonator is equal to an area of the second resonance region of the second resonator.

9. A filter comprising:
one or more series resonators connected in series between an input terminal and an output terminal; and
one or more parallel resonators connected in parallel between the input terminal and the output terminal,
wherein at least one of a series resonator located closest to the output terminal among the one or more series resonators and a parallel resonator located closest to the output terminal among the one or more parallel resonators is divided into two resonators,
wherein one of the two resonators is a first resonator and the other of the two resonators is a second resonator that is located closer to the input terminal than the first resonator and is connected in series to the first resonator,
wherein the first resonator includes a piezoelectric substance, and a first lower electrode and a first upper electrode that sandwich the piezoelectric substance so that the first resonator operates in a thickness extension mode,
wherein the second resonator includes the piezoelectric substance extending from the first resonator, and a second lower electrode and a second upper electrode that sandwich the piezoelectric substance so that the second resonator operates in the thickness extension mode,
wherein the first lower electrode and the second lower electrode share a single lower electrode, or the first upper electrode and the second upper electrode share a single upper electrode,
wherein no resonator other than the first resonator and the second resonator is connected to a wiring line that electrically connects the first resonator and the second resonator in series,
wherein the first resonator includes a first resonance region in which the first lower electrode and the first upper electrode face each other across the piezoelectric substance above an air gap or an acoustic mirror, and the second resonator includes a second resonance region in which the second lower electrode and the second upper electrode face each other across the piezoelectric substance above another air gap or another acoustic mirror,
wherein at least the second resonator of the first resonator and the second resonator includes a mass load film in the second resonance region, the mass load film being distributed uniformly throughout an entire area of the second resonance region and being distributed uniformly throughout an entire area of the first resonance region, if provided in the first resonator, and
wherein a ratio of a total area of the mass load film to an area of the second resonance region in the second resonator is greater than a ratio of a total area of the mass load film to an area of the first resonance region in the first resonator so that the second resonator has an antiresonant frequency less than an antiresonant frequency of the first resonator and has a resonant frequency less than a resonant frequency of the first resonator.

10. A duplexer comprising:
a transmit filter connected between an antenna terminal and a transmit terminal; and
a receive filter connected between the antenna terminal and a receive terminal,
wherein at least one of the transmit filter and the receive filter is the filter according to claim 9.

11. The duplexer according to claim 10, wherein:
the transmit filter is the filter according to claim 9, and
the input terminal is the transmit terminal and the output terminal is the antenna terminal.

12. The filter according to claim 9, wherein only the first resonator and the second resonator are electrically connected to the wiring line.

13. The filter according to claim 9, wherein an area of the first resonance region of the first resonator is equal to an area of the second resonance region of the second resonator.

* * * * *